(12) United States Patent
Burton et al.

(10) Patent No.: US 6,440,280 B1
(45) Date of Patent: Aug. 27, 2002

(54) MULTI-ANODE DEVICE AND METHODS FOR SPUTTER DEPOSITION

(75) Inventors: Clive H. Burton, Novato, CA (US); Rodney Pratt, Crafers; Frank Samson, Macclesfield, both of (AU)

(73) Assignee: Sola International, Inc., San Diego, CA (US)

(*) Notice: Subject to any disclaimer, the term of this patent is extended or adjusted under 35 U.S.C. 154(b) by 0 days.

(21) Appl. No.: 09/605,401

(22) Filed: Jun. 28, 2000

(51) Int. Cl.[7] ................................................ C23C 14/34
(52) U.S. Cl. ......................... 204/298.06; 204/192.12; 204/192.26; 204/298.23; 204/298.28; 204/298.14
(58) Field of Search ...................... 204/192.12, 192.15, 204/192.26, 298.06, 298.14, 298.13, 298.23, 298.28

(56) References Cited

U.S. PATENT DOCUMENTS

| | | |
|---|---|---|
| 2,758,510 A | 8/1956 | Auwarter |
| 4,172,156 A | 10/1979 | Ritter et al. |
| 4,420,385 A | 12/1983 | Hartsough |
| 4,478,702 A | 10/1984 | Gillery et al. |
| 4,600,490 A | 7/1986 | Gillery et al. |
| 4,619,755 A | 10/1986 | Hessberger et al. |
| 4,849,087 A | 7/1989 | Meyer |
| 4,851,095 A | 7/1989 | Scobey et al. |
| 4,865,710 A | 9/1989 | Aaron et al. |
| 5,106,474 A | 4/1992 | Dickey et al. |
| 5,333,726 A | 8/1994 | Makowiecki et al. |
| 5,336,385 A | 8/1994 | Shimose et al. |
| 5,487,821 A | 1/1996 | Sieck et al. |
| 5,502,139 A | 3/1996 | Toh et al. |
| 5,616,224 A | 4/1997 | Boling |
| 5,616,225 A | 4/1997 | Sieck et al. |
| 5,645,699 A | 7/1997 | Sieck |
| 5,683,558 A | 11/1997 | Sieck et al. |
| 5,719,705 A | 2/1998 | Machol |
| 5,942,089 A | * 8/1999 | Sproul et al. .......... 204/192.13 |

FOREIGN PATENT DOCUMENTS

| | | |
|---|---|---|
| DE | 123714 | 9/1901 |
| GB | 2180262 | 3/1987 |
| JP | 62-274076 | 9/1987 |

* cited by examiner

Primary Examiner—Rodney G. McDonald
Assistant Examiner—Gregg Cantelmo
(74) Attorney, Agent, or Firm—Burns Doane Swecker & Mathis, L.L.P.

(57) ABSTRACT

A method and apparatus for vacuum coating plural articles employs a drum work holder configuration and a sputter source with a plurality of individually controlled anodes for effectively providing uniform coatings on articles disposed at different locations on the drum work holder. A small number of measured process parameters are used to control a small number of process variable to improve coating uniformity from batch to batch.

47 Claims, 14 Drawing Sheets

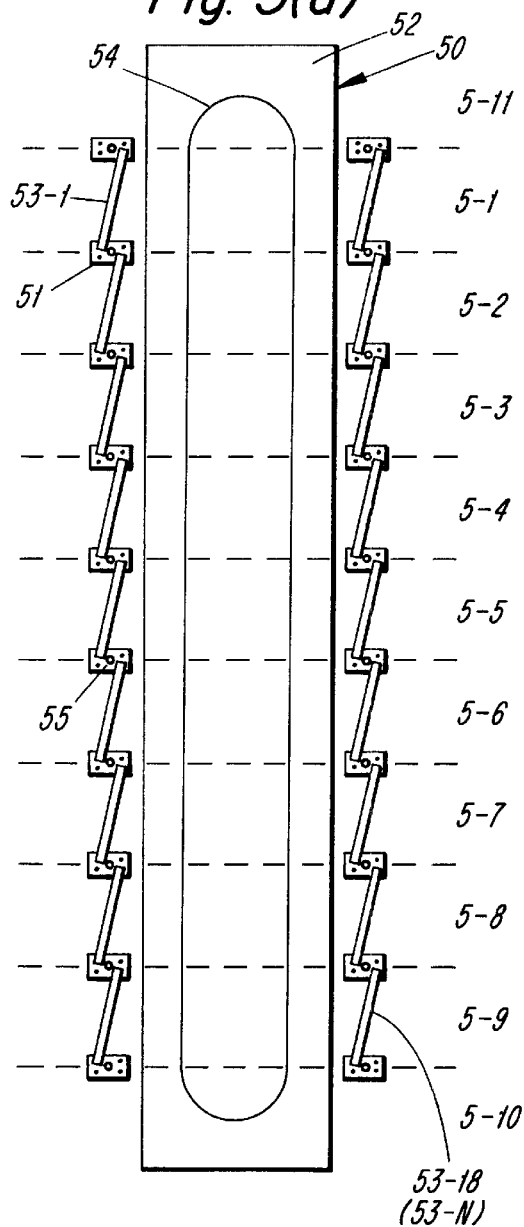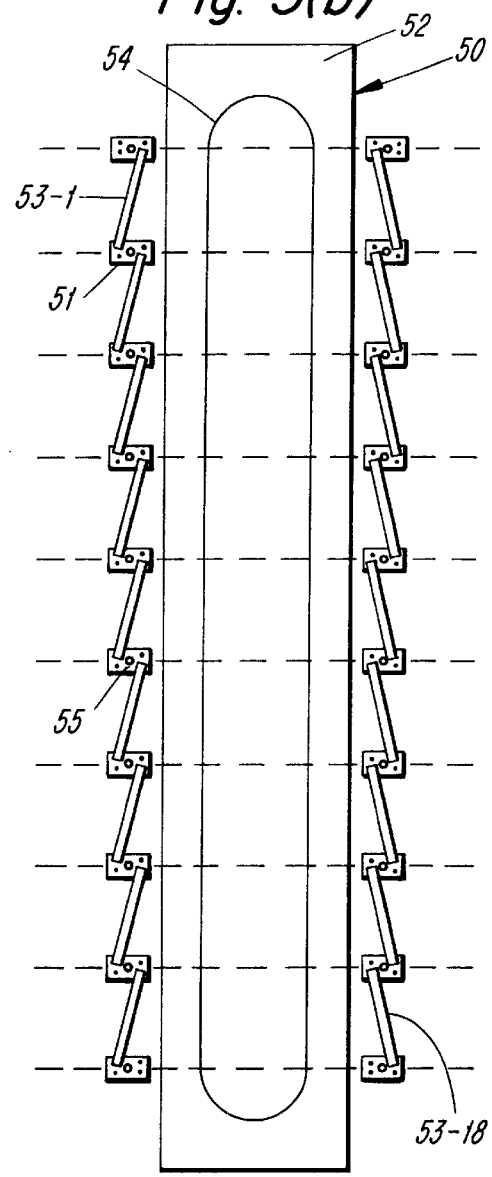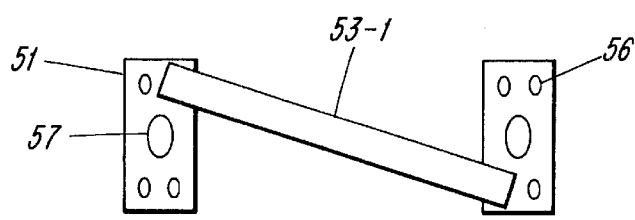

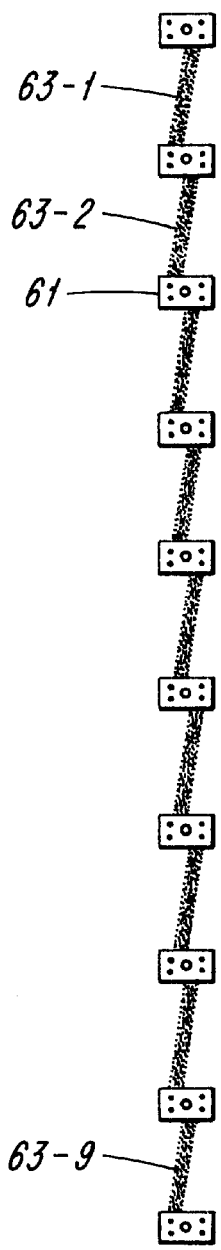
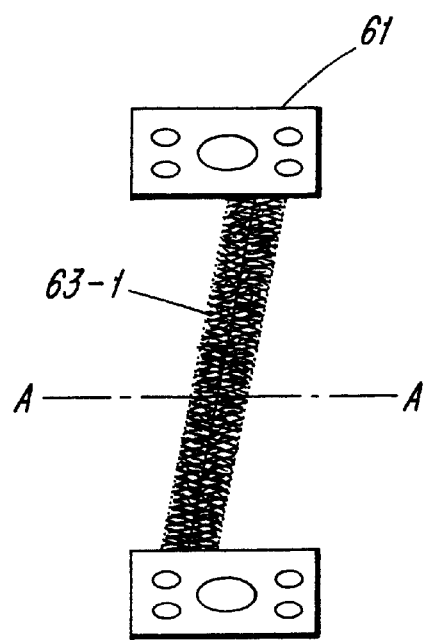
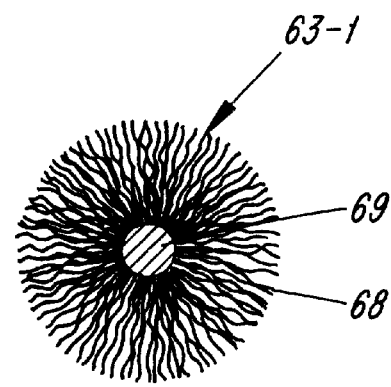
Fig. 6(a)
Fig. 6(b)
Fig. 6(c)

MULTI-ANODE DEVICE AND METHODS FOR SPUTTER DEPOSITION

FIELD OF THE INVENTION

The present invention relates to methods and apparatus for sputter coating articles, and especially, for reactive sputter coating of plastic ophthalmic lens elements using a sputter source with multiple anodes. As used herein, lens elements include, according to context, edged lenses, semi-finished lenses and lens blanks. Also included are wafers for forming laminate lenses or wafer blanks therefor. Ophthalmic uses of the lens elements include uses in eyeglasses, goggles and sunglasses.

BACKGROUND AND OBJECTS OF THE INVENTION

Many ophthalmic lenses produced today are made from a single plastic body or laminated plastic wafers. The plastic material may include thermoplastic material such as polycarbonate or thermoset material such as diallyl glycol carbonate types, e.g. CR-39 (PPG Industries). The material may also be a cross linkable polymeric casting composition such as described in U.S. Pat. No. 5,502,139 to Toh et al. and assigned to applicant.

Ophthalmic lens elements are frequently coated to achieve special properties. Anti-reflection coatings improve the transmittance of visible light and the cosmetic appearance of the lenses. Reflective and absorptive coatings may be employed in sun lenses to reduce light transmittance to the eye, to protect the eye from UV radiation and/or to impart cosmetic colorations to the lens. Coatings may also provide other beneficial properties such as increased hardness and scratch resistance and anti-static properties.

Desirable lens coatings may be created by applying single or multiple layers of metal, metal oxides or semi-metal oxides to surfaces of the lens element. Such materials include oxides of silicon, zirconium, titanium, niobium and tantalum. Metal and semi-metal nitrides are also used. Examples of such multilayer coatings are given, for example, in U.S. Pat. No. 5,719,705 to Machol entitled "Anti-static Anti-reflection Coatings", assigned to applicant. Interference filter coatings for sunglasses are disclosed, for example, in U.S. Pat. No. 2,758,510 to Auwärter. Other lens coatings are disclosed in International Application WO 99/21048 to Yip, et al., which is hereby incorporated by reference.

Various methods are disclosed in the prior art for applying metal and semi-metal oxide coatings to ophthalmic lenses. Such coatings have traditionally been deposited by means of thermal evaporation, and more recently, by electron-beam (e-beam) evaporation and reactive sputtering. Evaporations are typically carried out at vacuums better than 10E-5 Torr. Ritter et al. U.S. Pat. No. 4,172,156, for example, discloses e-beam evaporation in an oxygen atmosphere of Cr and Si to form coating layers on a plastic lens. The use of reactive sputter deposition to form various oxide layers on lens elements is disclosed in the above-mentioned '705 patent to Machol.

Reactive sputtering in general is a conventional technique often used, for example, in providing thin oxide coatings for such items as semiconductor wafers or glass lamp reflectors. Examples of various conventional vacuum deposition systems for the formation of coatings by reactive sputtering are disclosed in the following patents: U.S. Pat. No. 5,616,224 to Boling; U.S. Pat. No. 4,851,095 to Scobey et al.; U.S. Pat. No. 4,591,418 to Snyder; U.S. Pat. No. 4,420,385 to Hartsough; British Patent Application GB 2,180,262 to Wort et al.; Japanese Kokai No. 62-284076 to Ito; and German Patent No. 123,714 to Heisig et al.

The coating of plastic lenses in spinning drum coaters by means of sputtering technology, including DC reactive sputtering, is a relatively recent development. A conventional drum vacuum coating system used for this purpose is shown in FIG. 1. The system includes a vacuum chamber 11, which contains a hollow workpiece holder or drum 12. Lens elements, such as lens 13 are arranged in columns on an external surface of the drum 12. A coating applicator 14 is located near a wall of the vacuum chamber adjacent the drum 12. The coating applicator 14 may comprise a combination of magnetron sputtering sources and microwave plasma generators with a reactive gas supply such as disclosed in U.S. Pat. No. 5,616,224 to Boling, which is hereby incorporated by reference. Power is delivered to the coating applicator 14 by one or more power supplies (not shown) via an electrical lead assembly 17. A reversing power supply for arc suppression such as disclosed in U.S. Pat. No. 5,616,224 to Boling may be included. A sputtering gas is introduced into the vacuum chamber through gas-supply plumbing built into the coating applicator or through a separate port (not shown) on the vacuum chamber 11. The sputtering gas is controlled by a gas controller (not shown) and may be an inert gas such as argon or a reactive gas mixture such as argon/oxygen or argon/nitrogen.

The vacuum chamber 11 is evacuated by vacuum pumps (not shown) attached to a pumping plenum 15. A cryopumping surface, known as a Meissner trap, is conventionally provided in the form of cryocoils 16 in the plenum 15. A coolant with a temperature well below the freezing point of water flows through the cryocoils 16, allowing the Meissner trap to remove water vapor from the vacuum chamber 11. A Meissner trap may be advantageously configured in the vacuum chamber 11 rather than in the pumping plenum 15 to improve the cryopumping of water vapor. Such a configuration is especially useful when coating plastic lens elements because plastic lens elements have a tendency to outgas substantially more water vapor than conventional glass lenses, as disclosed in U.S. Pat. No. 6,258,218, hereby incorporated by reference.

A drum vacuum coating system with an elongated magnetron sputter source 14 such as that illustrated in FIG. 1 provides a convenient means of coating numerous lens elements or other articles. However, Applicants have observed that such systems typically do not produce uniformly thick coatings on multiple articles disposed in a given column of the drum 12 due to the variation in sputter rate along the length of the sputter source. In other words, an article or lens element positioned near the top of a given column may not receive a coating of the same thickness as an article or lens element positioned near the center of that column.

Several methods directed toward improving coating uniformity of sputtered films have been disclosed in the prior art. U.S. Pat. No. 5,645,699 issued to Sieck discloses a system comprising two cylindrical magnetron sputter sources, each with an anode substantially spanning the length of the sputter source, wherein the placement of a third anode between the two sputter sources has improved coating uniformity. U.S. Pat. No. 4,849,087 issued to Meyer discloses the use of multiple gas nozzles distributed along the length of a sputter source to deliver varying amounts of an argon/oxygen gas mixture to local regions of the plasma above the sputter target (cathode). Individual resistance probes disposed along the width of the substrate measure the local resistance of the coating and provide feedback signals to adjust the gas flow through the various nozzles to maintain uniform electrical resistance in various regions of the coating. While this approach provides control of the electrical resistance of the coating, it does not necessarily provide control of the coating thickness, a quantity of importance for optical coatings.

U.S. Pat. Nos. 5,487,821 and 5,683,558 to Sieck et al. disclose the use of "wire brush" anodes in conjunction with magnetron sputter sources and indicate that the wire-brush point density of an anode may be adjusted along the length of the sputter source to affect the uniformity of the deposited film. U.S. Pat. No. 5,616,225 issued to Sieck et al. discloses the use of wire brush anodes and the use of multiple anodes in conjunction with a single magnetron sputter cathode for coating substrates (especially large substrates) wherein the anode voltages may be individually controlled. The '225 patent indicates that this control may be utilized to improve the thickness uniformity of the deposited coating. The disclosure in the '225 patent, however, does not address controlling the thickness uniformity of reactive coatings deposited on large numbers of individual lens elements using an elongated magnetron sputter source in a drum vacuum coating system.

A need still exists to provide drum vacuum deposition systems for high volume production of individual articles, such as plastic lens elements, while ensuring a high degree of control over the thickness and composition of the coatings.

Accordingly, it is an object of the present invention to improve the degree of control over the thickness and composition of thin metal and semi-metal oxide coatings deposited on multiple articles, particularly plastic lenses, disposed on a rotatable holder in a vacuum coating system.

It is another object of the present invention to provide a multi-anode sputter source adapted to the geometry of a cylindrical drum vacuum coating system for depositing coatings on numerous plastic parts.

It is another object of the present invention to provide an apparatus for depositing a high quality coating on large numbers of plastic lens elements in a system which is relatively inexpensive to construct and operate.

These and other objects and features of the present invention will be apparent from the written description and drawings presented herein.

SUMMARY OF THE INVENTION

A drum vacuum coating system with an elongated magnetron sputter source provides a convenient means of coating numerous lens elements or other articles located on a rotatable drum. However, Applicants have observed that such systems typically suffer from the inability to produce coatings of uniform thickness on multiple articles disposed in various locations on the drum due to variations in the sputter rate along the length of the sputter source. Applicants have determined that providing an elongated sputter source with multiple anodes, wherein the currents to the anodes may be individually controlled or controlled in pairs, allows the deposition of coatings of substantially uniform thickness on multiple articles regardless of their position on the drum. The thickness uniformity is acceptable for thin optical coatings on ophthalmic lens elements.

A preferred embodiment of the present invention is a method and apparatus for sputter coating a plurality of articles such as plastic lens elements. The system includes a vacuum chamber, a rotatable cylindrical holder for holding the plurality of articles, and at least one sputter source that is elongated along a lengthwise direction and that has a cathode and a plurality of anodes. The sputter source is disposed with its lengthwise direction parallel to a rotation axis of the cylindrical holder, and the anodes are disposed adjacent the cathode substantially along at least one line parallel to the lengthwise direction. The articles may be disposed in a predetermined pattern on the cylindrical holder, and the anodes may be disposed in positions corresponding to positions of the articles disposed on the cylindrical drum. Additionally, the articles may be arranged in columns and rows on the cylindrical holder, the columns being parallel to the rotation axis of the cylindrical holder, and the anodes may be configured in pairs, each anode pair being aligned with a row on the cylindrical holder. The sputter source may be a planar magnetron sputter source.

A cathode power supply provides a negative voltage to the cathode, and a separate anode power supply with a plurality of channels provides anode currents to the anodes. Alternatively, the cathode power supply and the anode power supply may be provided in a single unit. The anodes may be configured in pairs, and each anode pair may be powered by a separate channel. In addition, the anode currents may be adjusted in a manner to produce coatings of increased uniformity of thickness on articles positioned in different locations on the cylindrical holder. In one embodiment, the same amount of current is provided to each active anode pair by the controlled power supply.

The length of the sputter source may range from twenty inches to sixty inches, though approximately forty inches is a preferred length. The number of pairs of anodes may range from six pairs to fifteen pairs. Eight or nine pairs of anodes are preferred. In addition, it is preferred that the length of each anode is approximately the same as the diameter (height) of the surface of article to be coated. The height and diameter of the drum may be approximately forty inches, and the drum may hold approximately 200 to 400 articles.

In order to prevent the buildup of dielectric material on the electrically active anodes each anode of the sputter source may be configured as an electrically conducting bar having a recessed slot, the slot being oriented such that the opening of the slot is directed away from the cathode. In this manner, anodes are provided with interior surfaces that remain substantially free of dielectric coatings, ensuring good electrical conduction between the anodes and the sputter plasma. Alternatively, the anodes may be configured as wire-brush anodes, wherein each anode comprises a plurality of electrically conducting wires emanating from an electrically conducting support member. This configuration similarly provides anode surfaces that remain substantially free of dielectric coating deposits at the root of the brush.

In another embodiment, the apparatus may be used to carry out reactive DC sputtering of a thin coating, which may comprise a dielectric layer deposited onto surfaces of plural articles such as plastic lens elements. In this case, the apparatus again includes a vacuum chamber and a sputtering source that is elongated in a lengthwise direction and that has a cathode and a plurality of anodes, the anodes being arranged in pairs. The apparatus also includes a rotatable article holder located in the vacuum chamber that rotates the plural articles past the sputtering source, the articles being arranged in a predetermined pattern on the article holder. The article holder may be a hollow drum rotated about its central axis. In addition, the apparatus includes a source of reactive gas, such as oxygen or nitrogen. An elongated plasma applicator, such as a microwave plasma generator, is also provided adjacent to the sputtering source for producing a plasma to facilitate the reaction of the reactive gas with material sputtered from the sputtering source. The sputter source may be a planar magnetron sputter source.

The articles may be arranged in columns and rows on the article holder, each anode pair being aligned with a row on the cylindrical holder. The reactive sputtering may comprise the sputtering of a metal or semi-metal utilizing a sputtering gas that contains oxygen in order to produce metal-oxide or semi-metal-oxide coatings. A sputtering gas comprising nitrogen may also be used to produce nitride coatings. In addition, a second sputtering source may be provided adjacent to the first sputtering source or adjacent to a plasma applicator for sputtering a metal or semi-metal different than that sputtered from the first sputtering source. In this manner, multiple coatings with different indexes of refraction may be provided on articles such as plastic lens elements.

The apparatus may further comprise a controller that receives an input signal corresponding to a small number of measurable process variables (for example, two) and which controls a small number of process variables (for example, two) in response thereto. In a preferred embodiment, the measurable process variables are cathode voltage and total gas pressure; the controlled variables are a first flow rate for a first gas and a second flow rate for a second gas. A purpose of the controller is to maintain batch-to-batch uniformity of coating thickness and coating composition. The controller may be used in roll coating or the coating of discrete articles such as lens elements as described below.

Batch to batch (run to run) stability of deposition rates of the sputtered materials may vary due to a number of causes even when the sputter plasma is held at a constant power dissipation. These causes includes: historical effects on the target (such as oxide coverage and oxygen implantation), target cleaning, tooling cleaning, chamber cleaning, length of time the chamber is opened for loading, unloading or servicing and consequent coverage of chamber and tooling with absorbed layers of water vapor, thickness of deposited materials on tooling and chamber, type of plastic constituting the lens substrates and their degree of water uptake, gas leaks, improper calibration of partial pressure gauges and/or other means of measuring partial pressures such as Optical Gas Controllers. Applicants have determined that, at constant sputter plasma power or constant sputter cathode current, more stable deposition rates may be obtained by manually adjusting two directly controllable process variables (in a preferred embodiment, the flow rates of the buffer gas (usually Argon) and the reactive gas (usually oxygen)) according to a set of rules based on observations of two measured input parameters (in a preferred embodiment, cathode voltage and total pressure). The rules may be experiential rules based on an expert's understanding of the operation of a particular sputtering system. These rules may be embedded in the fuzzy logic control system. For example input parameters may include classifying three levels of cathode voltage and total pressure: "LOW", "OK" and "HIGH". The output parameters for adjusting the operation of the system may include three classifications for the flow rates of the buffer gas and the flow rate of the reactive gas, namely: "INCREASE", "HOLD" and "DECREASE". The fuzzy logic determination may be implemented in control signals for opening or closing buffer gas and reactive gas valves by a precise amount.

In another embodiment, a multi-anode device for use in sputter deposition is provided. Note that the multi-anode device may be used separately from the above described gas control techniques. However, both techniques may be advantageously used to achieve a high degree of coating thickness uniformity.

The multi-anode device comprises a cathode and a plurality of anodes located in predetermined positions adjacent to first and second opposing sides of the cathode. The anodes disposed at each of the first and second opposing sides of the cathode are configured in a regular arrangement to substantially minimize or eliminate gaps between adjacent anodes. Further, a different current may be applied to each anode. Such a configuration may be desirable for facilitating uniformity of the sputter plasma. In particular, the anodes at a given side of the cathode may be configured in a sawtooth arrangement, wherein an end of one anode is disposed closer to the cathode than an end of the adjacent anode. The anodes at opposing sides of the cathode may be arranged identically or in a mirror image arrangement. The anodes may also be arranged in an essentially linear fashion wherein the ends of the anodes approach each other closely but are shielded from one another by interposing an electrical and/or physical barrier between said ends. In another embodiment, the ends of adjacent anodes may be purposely separated from, for example, 1 to 5 inches to modify electrical coupling of the anodes with one another through the plasma.

In addition, each anode of the multi-anode device may be configured as an electrically conducting bar having a recessed slot, the slot being oriented such that the opening of the slot is directed away from the cathode. Alternatively, the anodes may be configured as wire-brush anodes, wherein each anode comprises a plurality of electrically conducting wires emanating from an electrically conducting support member.

In another embodiment, a method for sputter coating a plurality of articles is provided. A vacuum chamber is provided having at least one sputter source with a plurality of anodes configured in pairs and having an article holder that rotates about an axis. Plural articles are located in a predetermined pattern on a radially outward facing surface of the article holder, and the chamber is pumped down. A sputtering gas of the desired composition, flow and pressure is provided, and the article holder is rotated relative to the sputter source. Sputter coating is carried out on the radially outward facing surfaces of the articles while controlling current to each pair of anodes separately.

The articles may be arranged in columns and rows on the outward facing surface of the article holder, and the rows may be aligned with pairs of anodes. The drum may be continuously or sequentially rotated relative to the sputter source or sputter sources while voltages are applied to the cathode and anodes to cause material to be sputtered from the sputtering target onto the radially outward facing surfaces of the articles. Further, the currents to the anodes may be adjusted in a manner to provide a uniform coating to the articles at all positions on the article holder. In addition, the sputter coating may comprise a reactive DC process in which sputtered material reacts with reactant gas to form a dielectric layer. The dielectric layer may comprise at least one layer of a metal oxide or semi-metal oxide. The articles may be plastic lens elements, and the sputter source may be a planar magnetron sputter source. In one embodiment of the invention the individual currents to be applied to each anode pair for each target material, in order to adjust uniformity, are determined before each coating batch by spectral measurements or otherwise on articles or witness samples coated during prior batches.

The foregoing has been provided as a convenient summary of aspects of the invention. The invention intended to be protected is, however, defined by the claims and equivalents thereof.

BRIEF DESCRIPTION OF THE DRAWINGS

FIG. 5(a) is an illustration in side view of an anode configuration according to another embodiment of the present invention;

FIG. 5(b) is an illustration in side view of another anode configuration different than that shown in FIG. 5(a);

FIG. 5(c) is an illustration in side view of an individual anode for the embodiments illustrated in FIGS. 5(a) and 5(b);

FIG. 6(a) is an illustration in side view of a wire-brush configuration of multiple anodes for a planar magnetron sputter source according to another embodiment of the present invention;

FIG. 6(b) is an illustration in plan view of an individual wire brush anode for the embodiment illustrated in FIG. 6(a);

FIG. 6(c) is a cross-sectional view of a wire brush anode for the embodiment illustrated in FIG. 6(a);

DETAILED DESCRIPTION

The disclosed embodiments address the need for effective control over the thickness of a deposited coating, particularly in systems containing drum workpiece holders and elongated magnetron sputter sources for coating numerous plastic lens elements.

Figure 1:
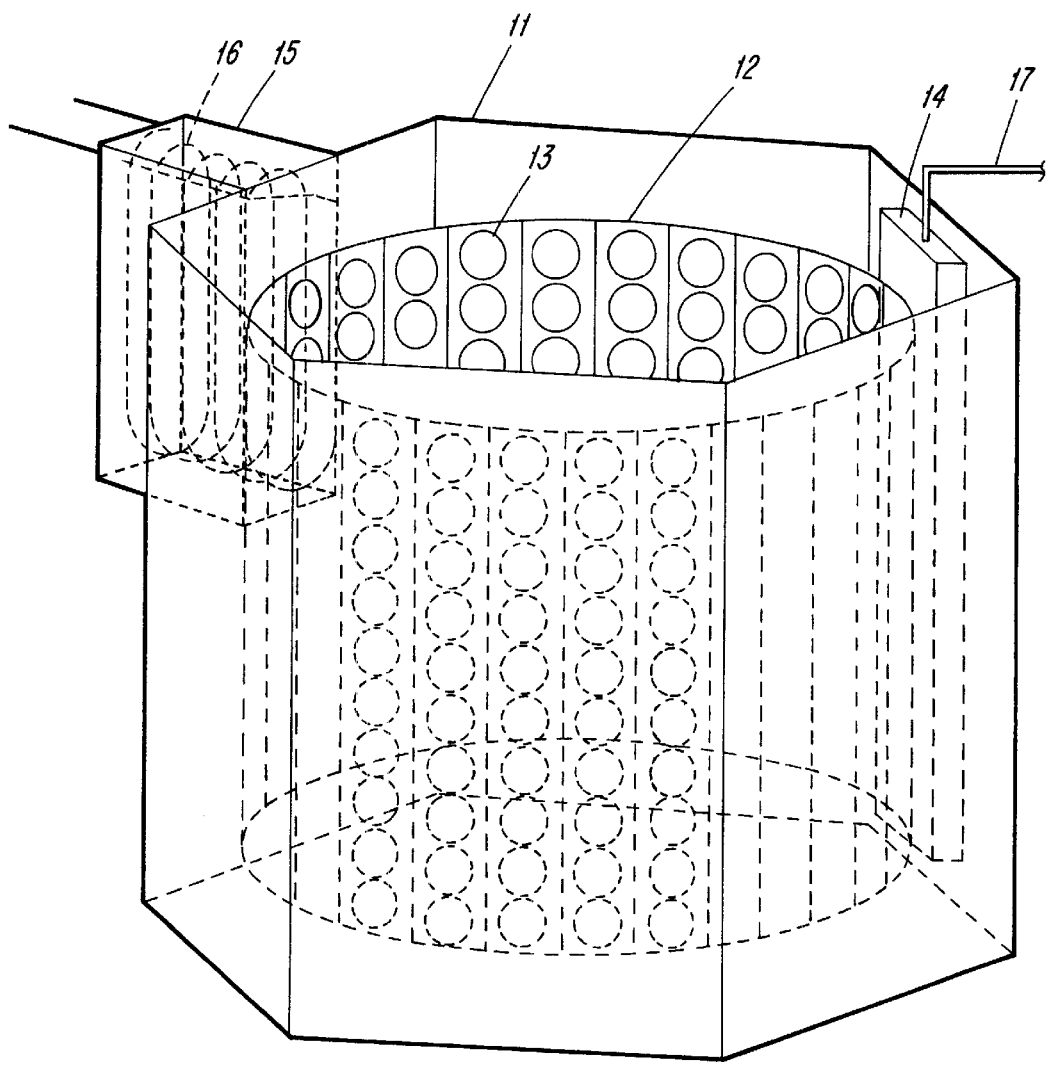
FIG. 1 is a pictorial view in partial phantom of a system known in the prior art for vacuum coating plural plastic lens elements.
Figure 2:
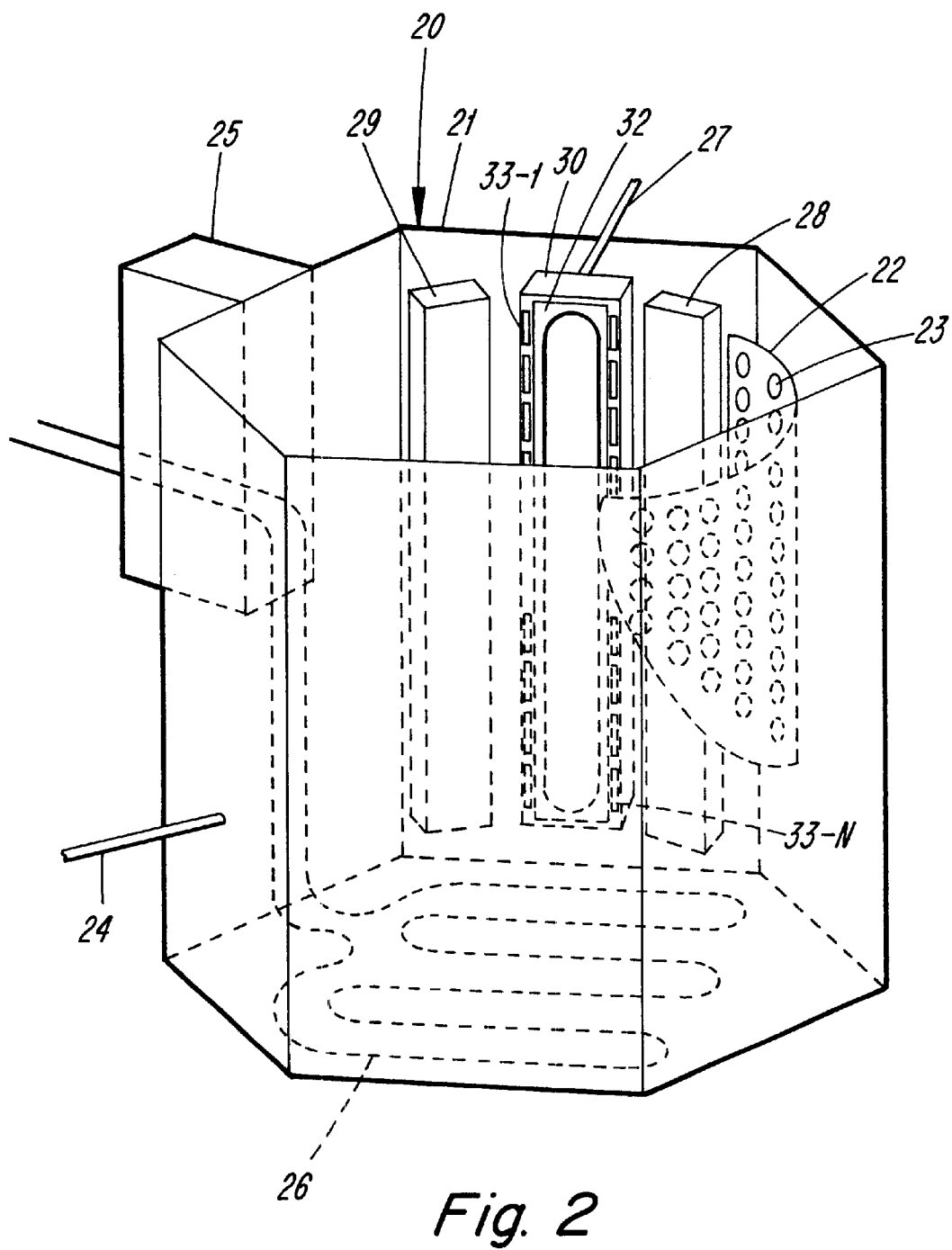
FIG. 2 is a pictorial view in partial phantom of drum vacuum coating system according to one embodiment of the present invention.

A first embodiment according to the present invention is a drum vacuum coating system 20 incorporating an elongated, planar magnetron sputter source 30 with a target (cathode) 32 and multiple anodes 33-1 through 33-N where N is the total number of anodes as illustrated in FIG. 2. The system 20 includes a vacuum chamber 21 with a pumping plenum 25 attached to vacuum pumps (not shown) for the purpose of evacuating the chamber 21. The chamber 21 contains a hollow, rotating drum 22 shown in partial phantom. Articles 23, such as plastic lens elements may be arranged in columns and rows on an external surface of the drum 22. The multi-anode sputter source 30 (described further below) is located near a wall of the vacuum chamber adjacent the drum 22. A hinged door (not shown) or a detachable top plate (not shown) may be used to provide access to the vacuum chamber 21 for loading articles 23 onto the drum 22.

A sputtering gas is introduced into the vacuum chamber through gas-supply plumbing built into the sputter source 30 or through a separate port 24 to the vacuum chamber 21. The sputtering gas is controlled by a mass-flow controller (not shown) and may be an inert gas such as argon or a reactive gas mixture such as argon/oxygen or argon/nitrogen for carrying out DC reactive sputtering.

A Meissner trap in the form of cryocoils 26 is optionally provided at the base of the chamber 21 and is especially beneficial when the articles to be coated are plastic lenses, which may outgas water vapor at a substantial rate. A similar Meissner trap (not shown) may optionally be provided at the top of the chamber. A coolant with a temperature well below the freezing point of water flows through the cryocoils 26, allowing the Meissner trap to remove water vapor from the vacuum chamber 21, improving the quality of the coatings as disclosed in U.S. Pat. No. 6,258,218.

Figure 3:
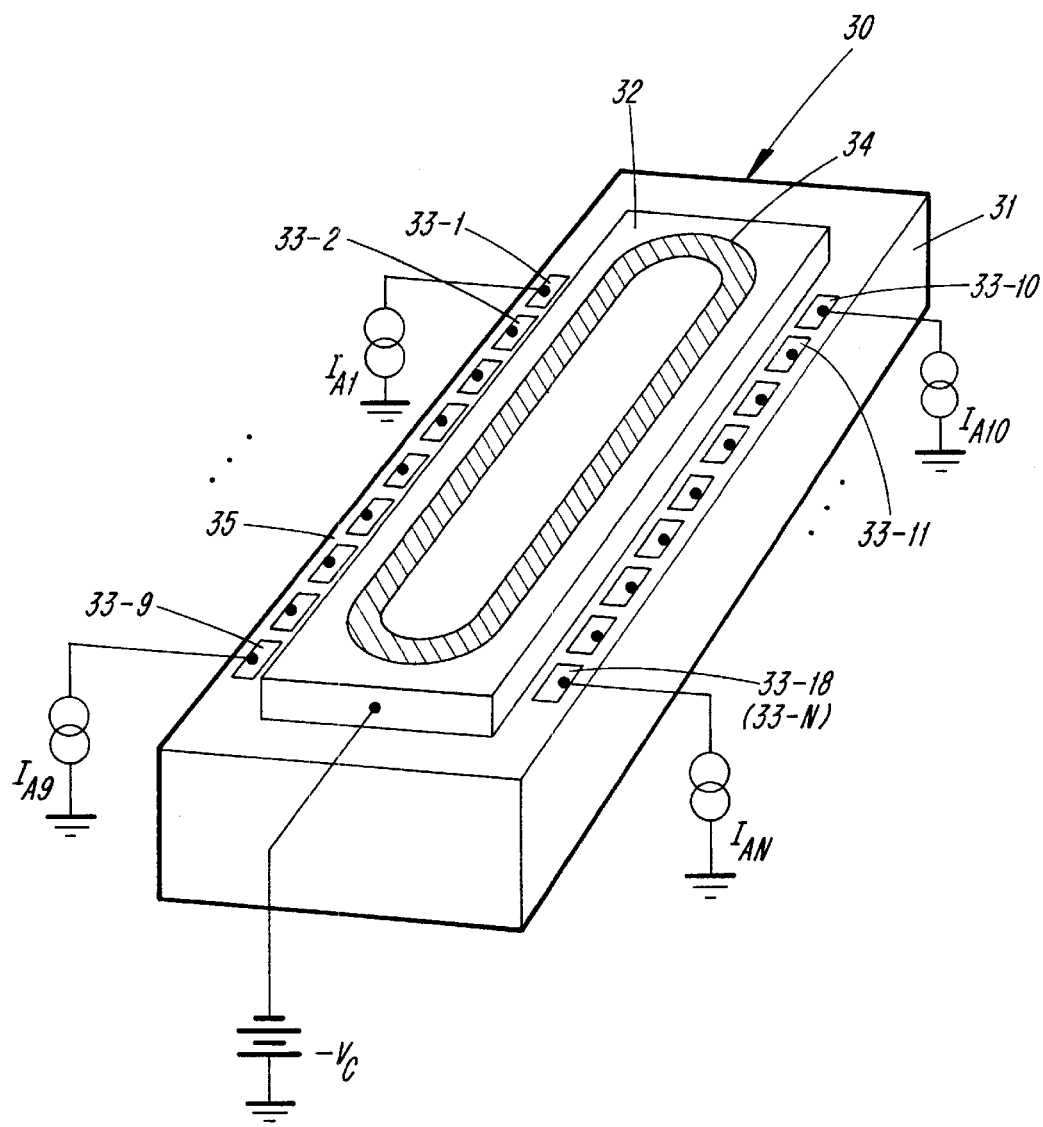
FIG. 3 is a pictorial view of a multi-anode planar magnetron sputter source such as that shown in FIG. 2.

Power is delivered to the multi-anode sputter source 30 by one or more power supplies (not shown) with optional computer control via an electrical lead assembly 27. As illustrated in FIG. 3, a negative cathode voltage -$V_C$ is applied to the target, and anode currents $I_{A1}$ through $I_{AN}$ are individually applied to the anodes. By controlling the voltages to the anodes individually, the spatial distribution of the plasma may be controlled to a large extent, thus allowing control of the rate of ejection of the target atoms from different regions of the target 32 defined by the positions of the anodes. Thus, individual control of the anode currents provides additional control over the thickness of coatings deposited on articles 23 positioned in proximity to the anodes. Arc suppression may be employed.

As shown in FIG. 2, plasma applicators 28 and 29, such as those described in U.S. Pat. No. 5,616,224 to Boling, may optionally be placed at each side of the sputter source 30 to provide additional sources of plasma that diffuse into the region above the target 32 of the sputter source 30. The additional plasma provided by the plasma applicators 28 and 29 may provide reduced arcing, enhanced deposition rate, and enhanced reaction of freshly deposited metal species in DC reactive sputtering. Power is delivered to the plasma applicators 28 and 29 by one or more power supplies (not shown) via electrical lead assemblies (not shown).

The coating process is carried out by first placing a collection of articles 23 in columns and rows on a radially outward facing surface of the drum 22. The vacuum chamber 21 is then pumped down to a desired base pressure, and a sputtering gas of the desired composition, flow and pressure is provided. The drum 22 is then rotated relative to the sputter source 30, and voltages are applied to the target (cathode) 32 and to the anodes to cause material to be sputtered from the sputtering target 32 onto the radially outward facing surfaces of the articles 23. The currents to the anodes are adjusted in a manner to provide a uniform coating to the articles at all positions on the drum 22. As mentioned above, the coating process may comprise a reactive DC process in which sputtered material reacts with reactant gas to form a dielectric coating. The drum 22 may be rotated continuously during the sputtering process, for example, at about 90 rpm.

Optionally, one plasma applicator rather than two plasma applicators as illustrated in FIG. 2 may be disposed adjacent to the multi-anode sputter source 30. Further, a configuration comprising two or more multi-anode sputter sources rather than one multi-anode sputter source 30 (as illustrated in FIG. 2) may be utilized. In a preferred embodiment, a plasma applicator may be disposed adjacent two multi-anode sputter sources, so that a substrate to be coated first encounters a first sputter source, then a second sputter source and finally the microwave applicator. Only one sputter source may be active during a "pass" made by the substrate.

Advantageously, first and second multi-anode sputter sources may include targets of different metal and/or semi-metal materials to form sequential coatings of diverse metals, semi-metals, and their oxides or nitrides on the lens elements, the coatings having different indices of refractions. Layers are built up by repeatedly rotating the lens elements on the drum past the sputter sources. For example, the system may be used to apply a multi-layer oxide coating to columns of lens elements whose radially outwardly facing optical surfaces have been treated with a hard coat. A five-layer coating comprising alternating layers of silicon oxide and zirconium oxide, the silicon oxide layers being outermost and innermost, is one such example.

The outer cylindrical face of the drum 22 is typically 2 to 9 inches from the target surfaces of the sputter sources. The drum itself may be on the order of 40 inches in diameter and 40 inches high and carry hundreds of articles 23 on its outer surface. Correspondingly, the sputter sources and plasma applicators (if present) may be on the order of 40 inches in length. A preferred number of lens elements disposed on the drum 22 is 200 to 450 articles 23.

The sputter source 30 illustrated in FIG. 2 will now be described in more detail with reference to FIG. 3. The sputter source 30 comprises a body 31, a target (cathode) 32, and a collection of anodes 33-1 through 33-N where N is the total number of anodes. The anodes may be configured as electrically conductive bars and may be made of aluminum, aluminum alloys, copper, copper alloys, stainless steel, other alloys, or other conductive materials. Individual electrical connections are made to the anodes and to the target (cathode) 32 using individual electrical leads of the lead assembly 27. Alternatively, separate electrical lead assemblies for the cathode and for the anodes may be used to provide the electrical connections. In the particular example shown in FIG. 3, there are eighteen anodes (N=18); however, it should be understood that the sputter source 30 may comprise a larger or smaller number of anodes. The body 31 encloses an assembly of permanent magnets (not shown) that substantially confine the plasma to an oval shaped racetrack 34. Such magnet configurations are well known in the art.

The body 31 and the target 32 of the sputter source 30 illustrated in FIG. 3 are substantially elongated and rectangular in shape. In addition the anodes may be disposed symmetrically in pairs along opposing elongated sides of the sputter source body 31 with one anode of an anode pair being disposed at one side of the target and the other anode of the pair being disposed at the opposing side of the target with both anodes positioned an equal distance from either end of the sputter source body 31. For example, in FIG. 3, opposing anodes 33-1 and 33-10 comprise an anode pair, opposing anodes 33-2 and 33-11 comprise an anode pair, and so forth. Insulating members (not shown) are provided between the anodes and the body 31 to provide electrical isolation of the anodes from the body 31. The body 31 (which would normally be the anode in the absence of the multi-anodes) will usually be attached to the chamber at ground potential. However this body rapidly becomes coated with insulating dielectric materials in reactive sputter coating so that the surface exposed to the plasma may float at a potential above ground potential and therefore lead to the well known wandering anode problem which contributes to non-uniform sputter deposition.

Figure 4A:
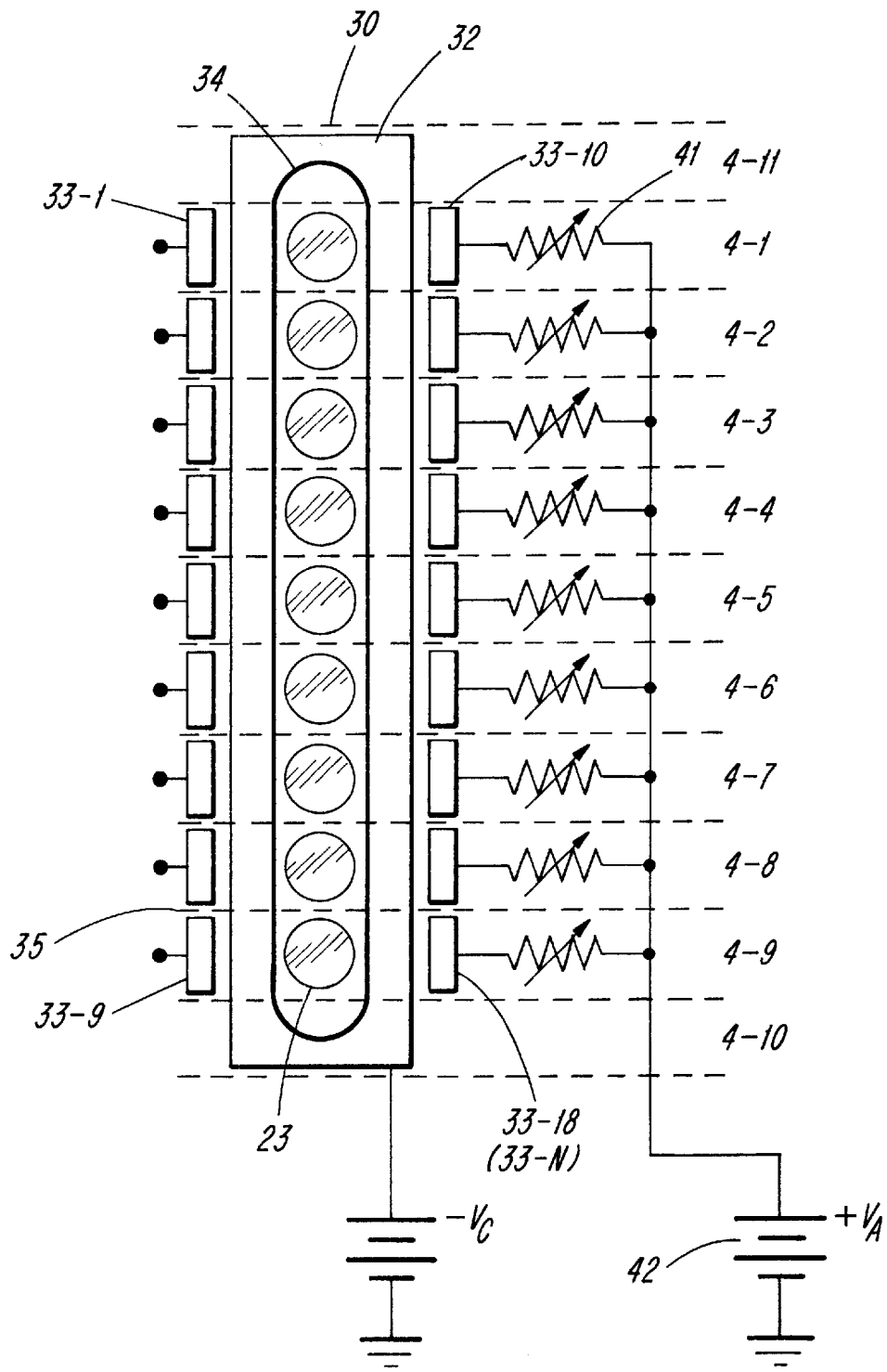
FIG. 4(a) is an illustration in side view of a multi-anode sputter source according to the present invention with anode pairs configured in zones corresponding to article positions on the drum holder.
Figure 4B:
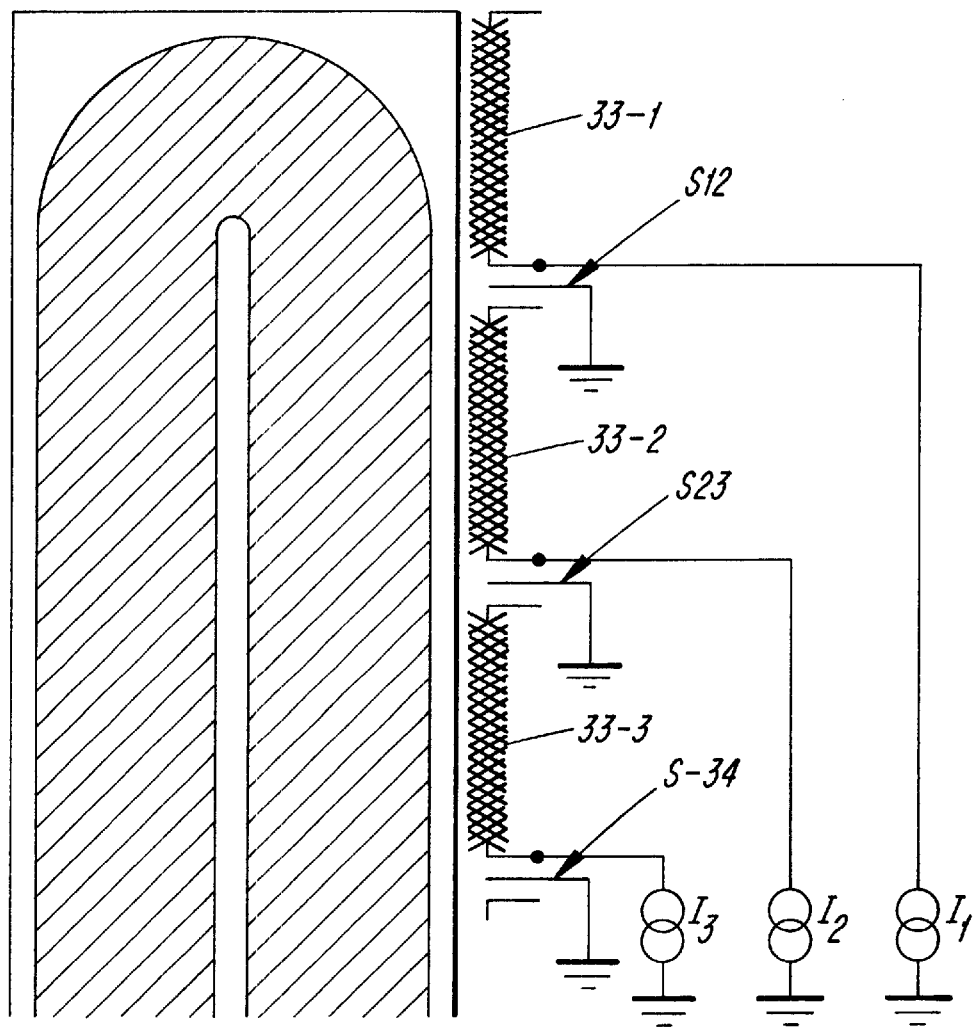
FIG. 4(b) is an illustration of an inside view of a portion of a multi-anode sputter source showing controlled current sources and anode shielding of a preferred embodiment of the present invention.

In a preferred embodiment according to FIGS. 2 and 3, the anodes of the sputter source 30 are configured to correspond to the placement and size of the articles 23 to be coated. Articles 23, such as plastic lens elements, are disposed uniformly on the drum 22 and may be arranged in vertical columns and horizontal rows. The elongated sputter source 30 is positioned vertically (parallel to the rotation axis of the drum 22) as shown in FIG. 2. The number of anode pairs may be equal to the number of rows of articles 23 disposed on the drum 22. The anodes may be uniformly and symmetrically arranged in pairs at opposing sides of the target 32 wherein the separation between anodes of an anode pair is the same for all anode pairs. Such a configuration is schematically illustrated in FIG. 4, which shows the projection of a column of articles 23 superimposed on a projection of the surface of the sputter target 32. In addition, pairs of anodes and rows of articles 23 are centered in zones 4-1 through 4-9 separated vertically by horizontal dashed lines as illustrated in FIG. 4. It should be understood that the column of articles 23 illustrated in FIG. 4 is displaced a distance away from the sputter target 32.

In addition, according to this embodiment and as indicated in FIG. 4, the end regions of the sputter target 32 that encompass the curved portions of the race track 34 are positioned in end zones 4-10 and 4-11 that do not contain articles 23. It is advantageous to exclude articles 23 from the end zones 4-10 and 4-11 because the racetrack 34 has a different geometrical configuration in the end zones compared to the inner zones as illustrated in FIG. 4. Though not shown, anode pairs may also be provided in end zones 4-10 and 4-11 to provide control of the plasma in these zones as well.

The configuration illustrated in FIG. 4 is characterized by nine pairs of anodes and nine rows of articles 23. It should be understood, however, that larger or smaller number of anode pairs and rows of articles 23 may be utilized. Configurations utilizing sputter sources ranging from twenty to sixty inches in length having six to fifteen anode pairs are advantageous. The use of sputter sources approximately forty inches in length having from six or ten anode pairs is preferred. It is also preferred that anode pairs in the same zone be connected together electrically and that they be supplied by means of a voltage limited constant current source for each zone.

As shown in the configurations illustrated in FIG. 4, the anodes may be configured with a length that is approximately equal to the vertical size of the articles 23. Such a configuration is advantageous for controlling the thickness uniformity of the coating deposited on a given article 23 as well as for controlling the coating thickness uniformity between articles 23. Anodes substantially shorter than the zone length may be desirable under some process conditions to electrically decouple them from one another.

The operation of the sputter source 30 will now be described in more detail with reference to FIG. 4. A simple version of the control scheme is shown in FIG. 4(*a*) wherein the variable resistors 41 are connected to a single positive potential source 42. Anode 33-1 is connected to anode 33-10 and then via the variable resistor 41 for zone 4-1 to the source 42. Similarly anode 33-2 is connected to anode 33-10 and then via the resistor 41 for zone 4-2 to the source 42 and so on.

The invention may be further understood by means of an example with reference to FIG. 4. Consider a 40-inch long by 5-inch wide silicon target 32 mounted on the multi-anode sputter source 30. With each variable resistor 41 initially set to zero ohms, all anodes 33-1 through 33-18 will be at ground potential. A voltage of −500 volts is applied to the target (cathode) 32 resulting in a total current delivered to the target of approximately 18.0 amperes when the source is energized in an argon/oxygen atmosphere at a pressure of a few millitorr. The anodes are controlled in pairs via the variable resistors such that anodes 33-1 and 33-10 form a pair, anodes 33-9 and 33-18 form a pair, and so forth. Given the target voltage and current noted above, each anode at ground potential draws approximately 1.0 Amps of current; each pair of anodes, therefore, draws approximately 2.0 Amps.

For simplicity we will assume that, in the absence of the source 42, with all variable resistors 41 set at zero, the multi anodes 33 are effectively connected to ground potential so that the anode current per sector is 2 Amps if they are all the same. The plasma impedance per sector will therefore be 250 ohms. Suppose we now install the source 42 and set it at +20 volts and set all the resistors 41 to 10 ohms. Assume the anodes 33-1 through 33-18 are not covered by dielectric coatings whereas the vacuum chamber walls in the vicinity of the sputter cathodes (and in the vicinity of the microwave applicator if present) are coated with insulating dielectrics and therefore will not act as effective ground points. The cathode current (composed of electrons in the plasma) will therefore preferentially flow through the anodes 33-1 through 33-18 to the positive potential $V_A$. It is still desirable to have a current flow of 2 Amps through each anode pair, the anode potential of each of the multi anodes will still be zero and the system will, to first order, operate as before. A major influence on the coating rate on articles on the work holder opposite those zones is the plasma density in them which, to a measurable and significant extent, is controlled by the electron current passing from cathode to anode in that zone.

Alternatively the positive supply 42 may be dispensed with and the common terminals of all variable resistors 41 connected to a good ground potential. This scheme will only work if the anodes 33-1 through 33-18 are effectively uncoated by dielectric whilst the chamber in the vicinity of the sputter magnetrons is substantially coated with electrically insulating dielectrics and therefore does not provide a good ground potential. Under these circumstances the variable resistors 41 can be used to adjust the anode currents up to the point where the anode potential becomes more negative than the effective ground plane of the nearby dielectrically coated chamber walls.

To provide more certainty than either of the previously discussed schemes for controlling the anode currents for each zone, it is desirable to provide separate constant current power supplies for each anode pair. These supplies may be set to a given voltage limit and a constant current appropriate to each zone in order to provide the desired uniformity profile Such an arrangement is shown in FIG. 4(*b*) which also illustrates a number of other preferred details of operation. In that Figure the anodes 33 are illustrated as wire brushes which have several advantages as previously noted. The constant current power supplies are indicated as I1 through I3 and these may be controlled by either digital or analog means but in either case it is preferred that their outputs be adjustable under computer control. It may occur that the potentials developed on the anodes in an effort to control current may rise to levels sufficiently different on adjacent anodes that a substantial current would flow between them. This is because they are to some extent bathed in a plasma which aids such electrical conduction irrespective of the fact that they are, when not bathed in a plasma at least, electrically insulated from the metal mounting bar on which they are mounted via ceramic insulators or the like. To obviate this possibility, it is desirable to install shields such as those illustrated as S12, S23 and S34 and so on between anode 33-1 and 33-2 and between 33-2 and 33-3 and so on. As these and the mounting bar will ordinarily become coated with insulating materials they will act as both a physical and an electrical barrier to the passage of current between adjacent anodes. The shields S12, S23 and S34 may be made of electrically insulated dielectric material.

In the embodiment illustrated in FIG. 3, adjacent anodes of the multi-anode sputter source 30 are separated by gaps 35. However, it may be advantageous to minimize such gaps in order to facilitate spatial uniformity of the plasma. Accordingly, another embodiment of the present invention minimizes the gaps between adjacent anodes as illustrated in side view in FIG. 5(*a*).

In another embodiment, adjacent ends of anodes in a line may be separated by a gap (for example a gap of 1 to 3 inches) or every other anode in the line removed to reduce undesired coupling between the anodes through the plasma.

FIG. 5(*a*) schematically illustrates a multi-anode sputter source 50 similar to that illustrated in FIGS. 3 and 4 but with a different anode configuration to minimize gaps between adjacent anodes. Anodes 53-1 through 53-N are uniformly and symmetrically disposed in pairs on opposing sides of a sputter target 52 in zones 5-1 through 5-10 separated by horizontal dashed lines. The individual anodes are attached to insulating mounting blocks 51 such that one end of each anode is disposed closer to the sputter target 52 than the other end of that anode. Further, except for mounting blocks 51 disposed near the ends of the sputter target 52, each mounting block 51 supports the ends of two anodes separated by a gap 55 in the horizontal direction. The anodes disposed at a given side of the sputter target 52 are thus positioned in a sawtooth-shaped arrangement as illustrated in FIG. 5(*a*). An identical anode configuration is disposed at the opposing side of the sputter target 52.

Unlike the embodiment illustrated in FIGS. 3 and 4 which possesses a gap in the vertical direction between the anodes, the embodiment illustrated in FIG. 5(*a*) possesses a gap in the horizontal direction with a minimal gap or no gap in the vertical direction. Thus in the vertical direction along the length of the sputter target 52, an anode surface is provided at substantially all vertical positions. Such an anode configuration may be desirable for facilitating spatial uniformity of the sputter source plasma.

An alternative anode configuration that possesses a minimal gap or no gap in the vertical direction is illustrated in FIG. 5(b). In this configuration, the anodes are disposed in a regular, sawtooth-shaped arrangement similar to that shown in FIG. 5(a). However, in the configuration shown in FIG. 5(b), anodes at opposing sides of the sputter target 52 are disposed in a mirror-image configuration.

A magnified illustration of one anode and two mounting blocks 51 is shown in FIG. 5(c). Each mounting block has an array of mounting means 56 for mounting an anode to the block via fastening means (not shown) at the bottom surface of the anode. For example the mounting means 56 may be holes extending through the mounting block 51, and the fastening means (not shown) may be bolts extending from the bottom surface of the anode. However, the mounting means 56 and the attaching means (not shown) are not to be limited to these examples.

Figure 5D:
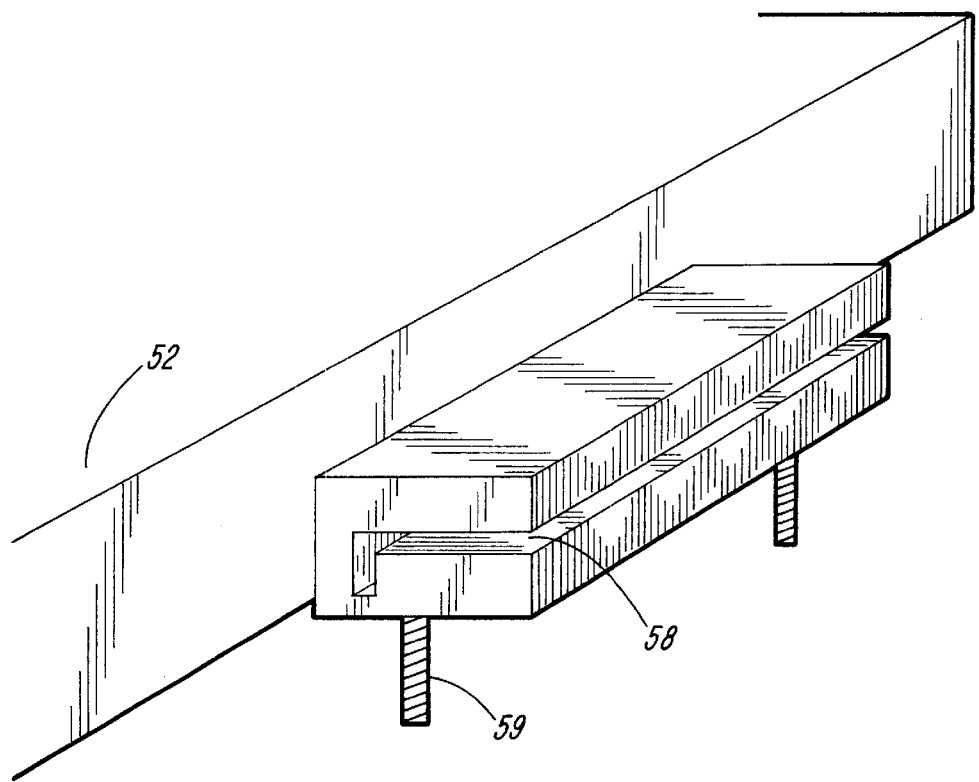
FIG. 5(d) is a pictorial view of an individual anode having a slot for maintaining an uncoated anode surface.

In a preferred embodiment, an anode configuration such as that shown in either FIG. 5(a) or FIG. 5(b) is provided with anodes possessing recessed slots 58 as illustrated in pictorial view in FIG. 5(d) to maintain anode surfaces that remain substantially free of coating deposits. In FIG. 5(d), an anode is illustrated with a recessed slot 58 disposed at an angle with the opening of the slot pointing away from the sputter target 52. Such recessed slots provide interior anode surfaces that receive less coating deposits during sputter deposition due to shadowing provided by the outer surfaces of the anode. This is especially beneficial in the reactive sputtering of dielectric materials (oxides and nitrides, for example) to ensure good electrical conduction between the anodes and the plasma. Also shown in FIG. 5(d) are bolts 59 as a particular example of fastening means extending from the bottom surface of the anode. The bolts not only provide a means of fastening the anode to the mounting block (not shown), but also provide a means of making electrical contact to the anode.

In another embodiment of the present invention, the multi-anode sputter source is configured with wire-brush anodes as illustrated in side view in FIGS. 6(a)–6(c). In FIG. 6(a) a sawtooth configuration of wire-brush anodes 63-1 through 63-9 for placement along one elongated side of a sputter source (not shown) is illustrated. It should be understood that an identical configuration or a mirror image configuration of anodes (not shown) is disposed at the opposing side of the sputter source (not shown) in a manner such as that illustrated in FIG. 5(a) or FIG. 5(b).

A magnified side view of anode 63-1 is shown in FIG. 6(b). FIG. 6(c) shows a cross-sectional view of anode 63-1, taken along plane A—A wherein a collection of individual metal wires 68 extends radially from a central electrically conducting support member 69. The central support 69 and the metal wires 68 may be formed from a variety of materials including, but not limited to, copper, brass, stainless steel, tungsten, and other electrical conductors. The density of wires 68 promotes effective shadowing of individual wires 68, thus allowing the surfaces of numerous wires 68 to remain substantially free of coating deposits. This is especially beneficial in the reactive sputtering of dielectric materials (oxides and nitrides, for example) to ensure good electrical conduction between the anodes and the plasma. The copper containing brush wires have the advantage that they tend to form conductive oxides. Sharp points on the ends of the wire lead to high electric field strengths which lead to breakdown of any oxides deposited on them.

The wire-brush anodes 63-1 through 63-9 are shown as being disposed below the mounting blocks 61 in FIG. 6(a). However, it should be understood that the wire-brush anodes may be attached to the tops of the mounting blocks 61 in a manner similar to that shown in FIGS. 5(a) and 5(b) that minimizes or eliminates vertical gaps between adjacent anodes. Alternatively, the wire-brush anodes may by configured in a manner similar to that shown in FIGS. 3 and 4, wherein vertical gaps exist between adjacent anodes.

The embodiments above have been described with reference to an elongated planar magnetron sputter source. However, it should be understood that the invention disclosed herein may be practiced in conjunction with a rotating cylindrical magnetron sputter source as well. In this case, the multiple-anode configurations illustrated in FIGS. 2–6 are applied to a rotating cylindrical magnetron sputter source.

The electrical control of the anodes discussed previously with reference to FIG. 4 utilized variable resistors electrically connected between the anode and an electrical ground. However, control of the anodes may also be achieved with a multi-channel high-current power supply such as the power supply 70 illustrated in FIG. 7(a).

Figure 7A:
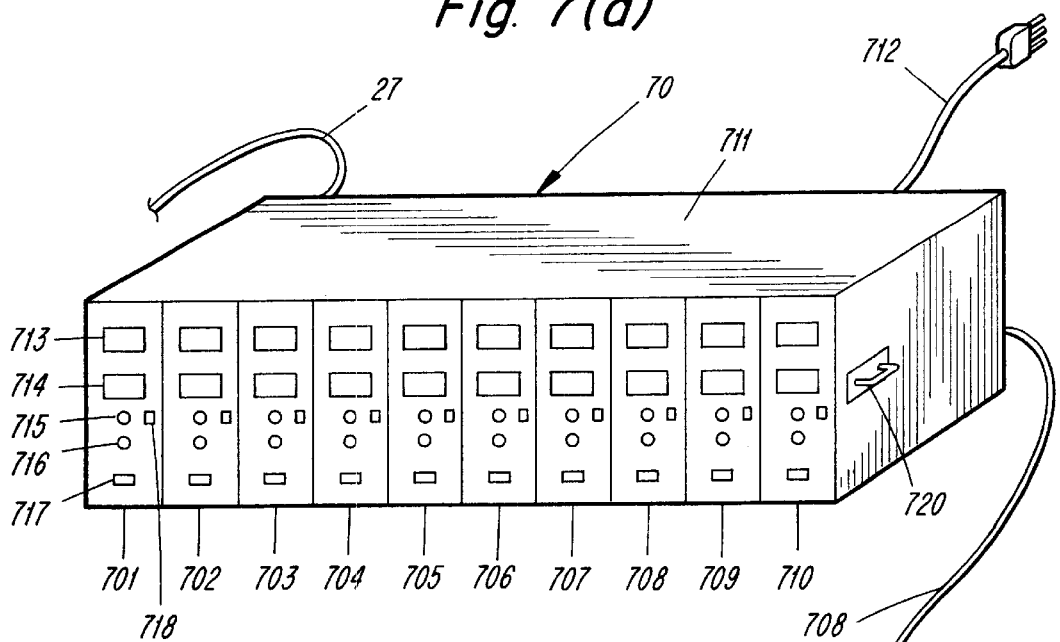
FIG. 7(a) is a pictorial illustration of a multi-channel high-current power supply for use with a multi-anode sputter source.

The multi-channel high-current power supply 70 illustrated in FIG. 7(a) comprises a housing 711, a power supply cord 712 that delivers power to the power supply 70, a main power switch 720 that controls the power to the power supply, and ten channels that each control the voltage and current delivered to a pair of anodes of the sputter source 30. If desired, a channel of the power supply may be used to control a single anode rather than a pair of anodes. Preferably, the power supply 70 is rack mountable in a conventional electrical mounting rack.

Each channel of the power supply 70 comprises a voltage readout 713, a current readout 714, a voltage control member 715, a current control member 716, and a channel power switch 717 to control power to an individual channel. Preferably the readouts 713 and 714 are digital LED or LCD readouts. The control members 715 and 716 may analog or digital potentiometers.

Figure 7B:
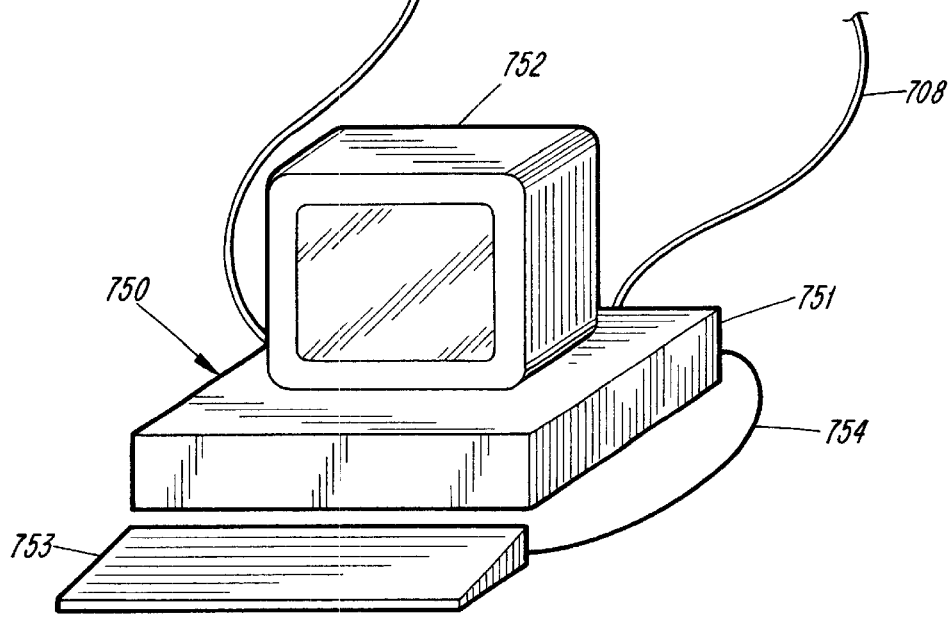
FIG. 7(b) is a pictorial illustration of an optional computer controller for use with the power supply illustrated FIG. 7(a)

Each channel of the power supply 70 also comprises a manual/remote switch 718 that allows an operator select between manual control of the voltage and current using control members 715 and 716 or computer control of the voltage and current using an optional computerized controller 750 shown in FIG. 7(b). The controller 750 may be connected to the power supply 70 via interfaces at the rear of the controller 750 and power supply (not shown) using a detachable connecting line 708.

The controller 750 illustrated in FIG. 7(b) comprises a CPU 751, a display 752, and a keyboard 753 connected to the CPU via a connecting line 754. The CPU 751 further comprises interfaces (not shown) at the rear of the CPU for sending and receiving signals to and from the multi-channel power supply 70 and other equipment (not shown) of the drum vacuum coating system 20. For example, the controller 750 may control mass flow controllers (not shown) and receive signals from pressure measurement and voltage measurement equipment (not shown) for controlling the pressure, flow and ratios of sputtering gases such as argon, oxygen, nitrogen, and others.

The controller 750 may also receive signals from coating thickness monitors such optical thickness monitors disposed in each coating zone shown in FIGS. 4 and 5 to provide real-time feedback control of the anode voltages. Such real-time feedback obtained from optical coating thickness monitors provides an advantageous method for maintaining coating thickness uniformity among the various coating zones illustrated in FIGS. 4 and 5. The controller 750 may also be used to monitor and control the cathode power supply (not shown). One purpose of such control would be to adjust the total current from the cathode power supply to match the total current applied to the anodes by means of the constant current power supplies. Detachable signal lines 705 may be used to pass electrical signals between the controller 750 and such equipment.

As noted above a real-time feedback method utilizing signals from optical coating thickness monitors may be used to provide real-time control of the anode currents via the controller 750 and the multi-channel high-current power supply 70 shown in FIGS. 7(*a*) and 7(*b*). Alternatively, post-deposition coating-thickness measurements may be carried out on articles coated during a given batch run to provide information that may be used to adjust the currents to anode pairs in subsequent runs. This latter approach provides a method for achieving coating-thickness uniformity that is simple to implement and that does not require a computerized controller 750.

There are a number of subtleties to be considered in the implementation of the multi anode scheme of control. Firstly it is usual that the sputter power supply potential is switched to about 100 volts positive for a brief period on a cyclic basis e.g. for about 20 microseconds every 200 microseconds. The purpose of this is to discharge the islands of metal oxide on the target which would otherwise build up charge to the point where they would lead to an electrical breakdown of the oxide film and consequently cause a localized arc which has various deleterious effects. In a conventional system there is a difficulty with this technique in that, as soon as the sputter power supply begins to reverse its polarity, the sputter plasma dies and there are few electrons left to neutralize the positive charge on the islands of oxide. Furthermore, the few electrons which are left to do this duty are bottled up in the magnetic field of the sputter magnetron and are not at liberty to neutralize charge on the islands of oxide outside the magnetic bottle where they are most needed.

In a known conventional system (the MicroDyne™ System) the existence of the microwave supported plasma nearby is supposed to overcome these difficulties in two ways. During the polarity reversal of the sputter power supply the microwave supported plasma is still operational and is able to supply the electrons needed to neutralize the charged metal oxide islands. Furthermore, the electrons from the microwave plasma are outside the magnetic bottle of the sputter magnetron and are therefore able to reach said islands without difficulty.

However, during the polarity reversal of the sputter power supply, the constant current generators attached to the anodes are trying to gather their allotted requirement of electron current which is typically on the order of two or a few amperes per anode pair. The dying sputter plasma will not be able to supply this electron current during said polarity reversal and the constant current power supplies will attempt to draw it from the surroundings, that is from the microwave plasma if present. In any case the positive potential on these constant current power supplies is likely to rise until they reach their voltage limit at which point they will draw whatever electron current is available to them at that voltage limit and which may be significantly below the constant current set point. This is of no consequence to the overall operation of the system with one important proviso: that the constant current power supplies stay in or instantly return to their constant current mode when the sputter power supply ceases its brief cyclic polarity reversal.

The response of the system to an arc also bears consideration. When an arc occurs as described previously or due to other causes, modern sputter power supplies respond very quickly by lowering the cathode voltage from a few hundred volts negative potential to near zero volts thus quenching the arc. The sputter power supply voltage may be kept near zero for some milliseconds to ensure the arc does not reoccur when the cathode voltage is returned to normal. During this arc-quenching period the multi anode constant current power supplies are again going to scour the surrounding volume for electrons and behave in the same manner as previously described when the sputter plasma dies during brief cyclic polarity reversals of the sputter power supply. However, in this case the impact on the microwave plasma will be of longer duration and the drain of electrons from it may be evidenced by a longer period in which the microwave power source is mismatched to the plasma. The microwave power reflected from the plasma may have deleterious effects on said microwave power source and these need to be monitored and guarded against if necessary. At the cost of additional complication it may be deemed necessary or desirable to shut down the constant current power supplies to the multi anodes during periods of sputter power supply polarity reversal or arc quenching.

Process Variable Monitoring and Control

In another preferred embodiment, a controller monitors process variables and controls process parameters to improve batch-to-batch uniformity of coating thickness and coating composition.

Reactive sputtering systems have a large number of process variables including the following:

(1) oxygen partial pressure
(2) argon partial pressure
(3) total system pressure
(4) water vapor partial pressure
(5) pump down time to base pressure
(6) cathode voltage
(7) kilowatt hours of use on each target since new
(8) kilowatt hours on each target since last target cleaning
(9) number of minutes of door open between runs
(10) calibration drifts and inaccuracies of vacuum gauges
(11) contamination of gauges especially of the Optical Gas Controller
(12) test usage of targets for deposition of thick single layers
(13) time since last shield clean
(14) lens substrate type
(15) lens hardcoat type
(16) substrate pretreatment
(17) lens form Many of these process variables are directly or indirectly controllable. The interrelationships and dependencies of the variables are complicated. Applicants have determined that the cathode voltage and total system pressure are sensitive indicators of the operating point and thus of deposition rate. Applicants have also determined that it is possible to take an expert system operator's knowledge of DC reactive sputter stabilization and effectively use it in a Fuzzy Logic Control System for reactive sputter deposition.

Work with such a system indicates fuzzy logic control can improve batch to batch stability by a factor of almost 5 using just two inputs and adjusting just two outputs. The two inputs used were Cathode Voltage and Total Pressure as measured on an MKS Baratron. The latter happens to be one of the very few instruments used in a vacuum measurement which has very acceptable long term drift performance.

The fuzzy logic can effectively encode the knowledge of an expert operator in systems which preferably have just a few important input variables and likewise just a few output controls. As the above list indicates, there are actually very many input variables to the deposition process. However, as discussed below, a few key measured parameters and controllable output variables can be identified.

Figure 8:
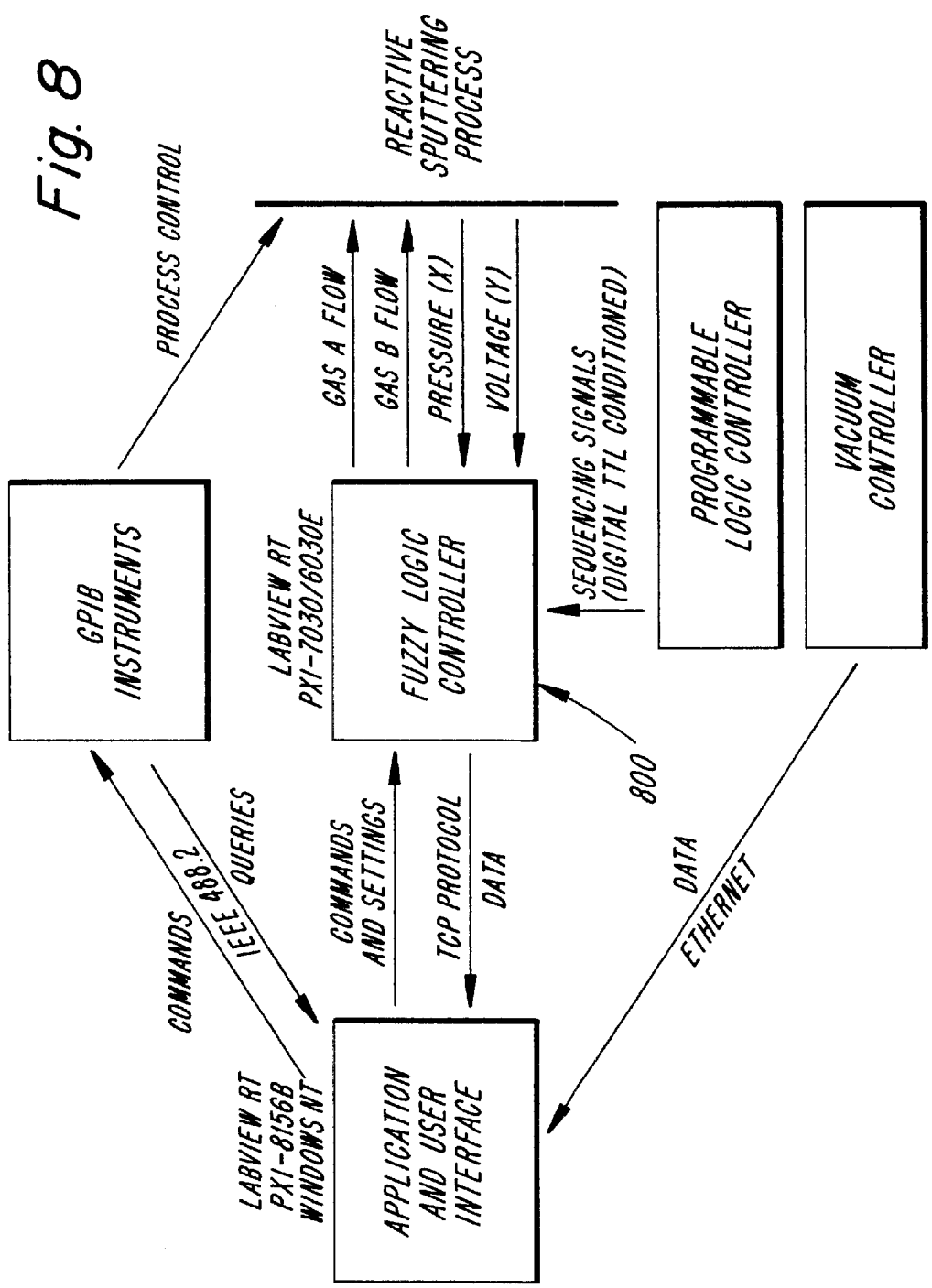
FIG. 8 is a block diagram illustrating a fuzzy-logic control method according to the present invention.

FIG. 8 illustrates a fuzzy logic system of a preferred embodiment of the present invention. The fuzzy-logic controller is preferably used to control the system. The anode currents are controlled utilizing the power supply 70 with or without the controller 710 as described above.

As shown in FIG. 8, input signals corresponding to the magnitude of the target (cathode) voltage and the total sputtering gas pressure are monitored by the fuzzy logic controller 800. Depending upon the magnitudes of the total gas pressure (X) and cathode voltage (Y), the cathode voltage and total pressure signals are categorized by the fuzzy-logic algorithm as high, medium, or low values.

The fuzzy-logic algorithm then applies predetermined rules based on these categorizations to provide output signals to mass flow controllers to adjust the flow rates of sputtering gases A and B. For example, if the cathode-voltage signal is monitored (or set) as a "high" value, and the total-pressure signal is monitored (or set) as a "medium" value, output signals corresponding to particular values of flow rates are directed to the mass flow controller that controls the flow of process gases A and B. The desired flow rates are determined by the fuzzy-logic controller according to rule-based algorithm. Input signals corresponding to different categorizations of cathode voltage and total pressure may yield different output signals resulting in different flow rates for the process gases (reactive and non-reactive) A and B. In this manner, batch-to-batch uniformity of coating composition and coating thickness is maintained. The fuzzy-logic rule-based algorithm may also be employed in the computer controller 710 rather than in a separate fuzzy logic controller 800.

It may be necessary to have some form of averaging process applied to the inputs (cathode voltage and total pressure). The averaging period is tied to the natural time constants of the measurement equipment, gas supply systems and the sputter process itself. An adaptive control system may be needed which in effect operates like a servo system based on first and second derivatives of the error signal where the error signal is, for instance, the difference between the instantaneous value of an input parameter and its average value as formed by the averaging process. The effect of this is to allow the fuzzy logic system to quickly reach a point near the desired operating point and then settle closer to it on the basis of longer term averages.

Because the process environment changes rapidly, the system employs deterministic real-time control in order to guarantee process stability. LabVIEW RT (a product of National Instruments Co.) may be used as the software platform to run the fuzzy logic control routine. The software is run on a PXI-7030/6030E real-time data acquisition card. Besides the two analog I/O signals required for fuzzy control, the 6030E also required additional analog signals for process monitoring and additional digital signals from an existing Programmable Logic Controller (PLC) which controlled sequencing of the batch. LabVIEW RT running on the Windows NT host PC was used for the user interface, data presentation, saving data to file, additional SCADA functions via GPIB and Ethernet, and editing the fuzzy control strategy. A Transmission Control Protocol (TCP) communication link is used to send fuzzy control strategies and commands to, and receive process data from, the LabVIEW program running on the real-time card. By separating the data and process control layers from the user interface and presentation layers, the process control algorithm can run reliably with deterministic timing. It is not affected by the CPU requirements of Windows NT or other programs running in Windows. LabVIEW RT made this possible.

LabVIEW RT allows the fuzzy logic control algorithms to be run on a real-time data acquisition card with an embedded processor. Exemplary system requirements are:

Real-Time Deterministic Control

Fuzzy Logic Controller

Analog Signal Interface for multiple Inputs and Outputs

Digital Signal Interface for Acquiring from a Programmable Logic Controller (PLC)

GPIB interface for Instrument Communication

Ethernet Interface for Communication to a Vacuum Control System

The National Instruments PXI platform may be used as the PC architecture for the system.

The Fuzzy Logic Toolkit for LabVIEW may be used as a basis for a customized fuzzy logic editor. This editor allows the operator to easily toggle between the membership functions of the inputs and outputs, as well as edit the rulebases for both outputs. The amount of time required for the operator to precisely tune to the control algorithm is reduced. As the system or product requirements change, the algorithm can be readjusted to account for these changes.

Figure 12A:
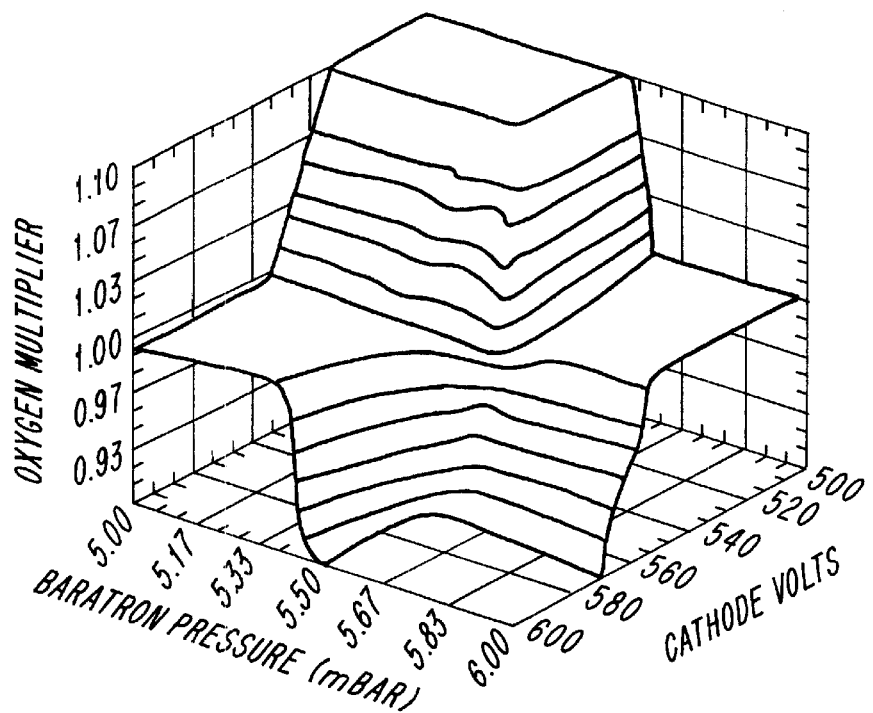
FIGS. 12(a) and (b) are depictions of three dimensional control surfaces usable in an embodiment of the present invention.
Figure 12B:
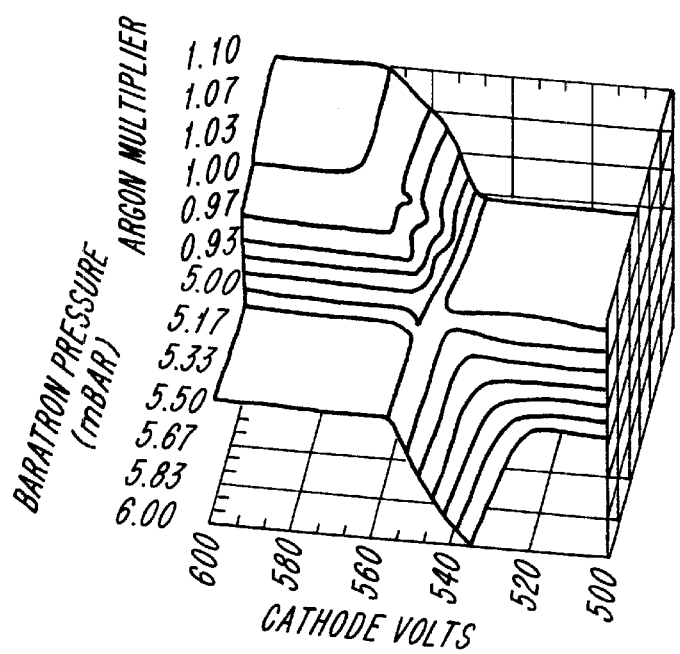

Also, using the 3D graphing capabilities of LabVIEW 5.1, control surface plots can be created from the fuzzy logic controllers for the operator to view. These plots can be rotated in 3 dimensions for careful inspection (see FIGS. 12(a) and 12(b). The operator can zoom in on regions of interest when tuning the system.

Even though the inputs of the system are defined with imprecise terms like High, Low, and OK, the fuzzy logic system is actually completely deterministic. For any set of input values there is a unique set of outputs. The fuzzy controller allows intuitive knowledge about a process to be realized in a controller.

The described fuzzy logic system uses only two out of the many possible input parameters and uses only two outputs of a number of possible control outputs. The particular functions and rule strengths etc. will be a function of the vacuum system; the materials being deposited, etc. An implementation and example of use of the techniques in a particular system will now be discussed.

Fuzzy logic process

Figure 9:
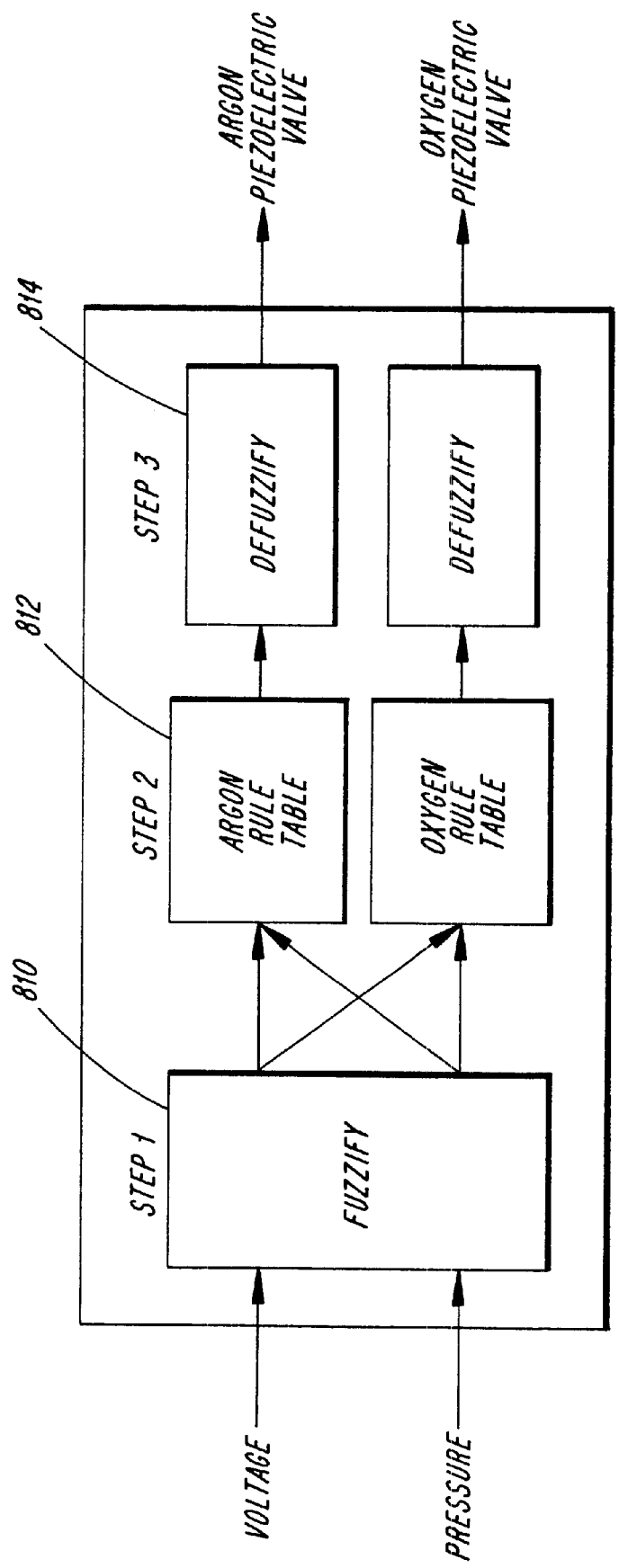
FIG. 9 is a flow diagram illustrating a fuzzy logic technique of a preferred embodiment of the present invention.
Figure 10A:
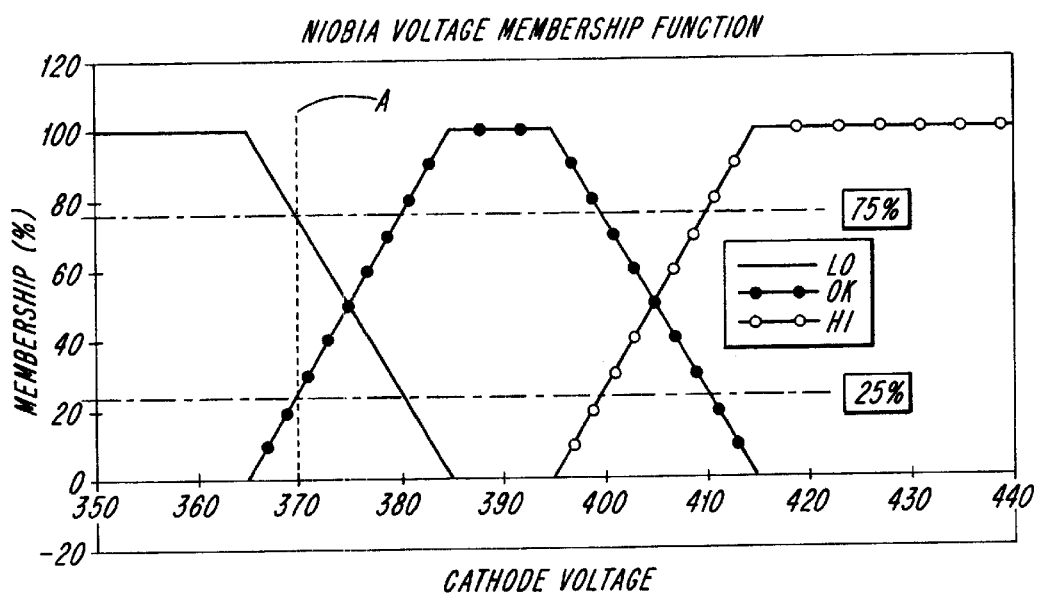
FIGS. 10(a) and 10(b) are plots of class membership as a function of cathode voltage and pressure, respectively, for a system presented as an example embodying teachings of the present invention.
Figure 10B:
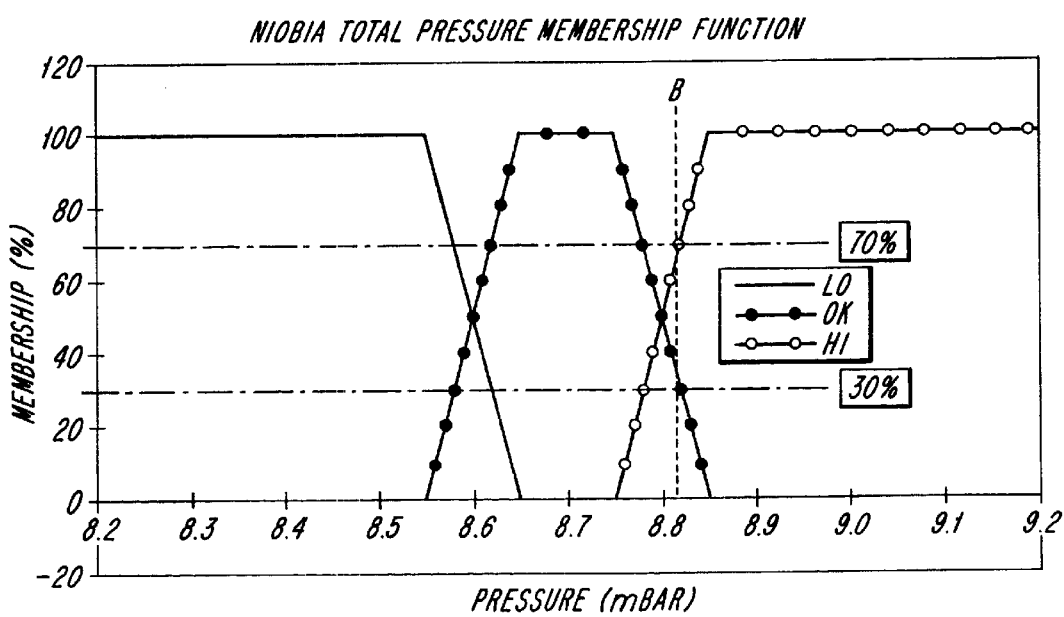

FIG. 9 is a flow diagram illustrating a preferred fuzzy logic technique of the present invention. In the indicated first step 810, the inputs are "Fuzzier", that is, classified into their membership of fuzzy sets with linguistic definitions such as "low", "OK" and "high". The classification of Cathode Voltage and Total Pressure in the low, OK and high categories is shown in FIG. 10(a) and 10(b), respectively. More specifically, FIG. 10(a) shows the cathode voltage membership function for reactive sputtering of Niobium to form Niobia. FIG. 10(b) shows the corresponding membership function for total pressure.

Evaluation of Rules

As a second step 812, a Rule Table is employed (based on expert's knowledge or experimentation) which tells the system "what to do" with control settings for all possible category combinations of the input membership functions.

The Rule Table for this example is shown below in Table I.

TABLE I

| Sputter Voltage | Sputter Pressure | Flow Adjustment |
| --- | --- | --- |
| Low | High | Argon DECREASE |
| Low | Low | Oxygen INCREASE |
| High | High | Oxygen DECREASE |
| High | Low | Argon INCREASE |
| OK | High | Argon DECREASE |
| OK | Low | Argon INCREASE |
| High | OK | Oxygen DECREASE |
| Low | OK | Oxygen INCREASE |

Note that all other possible combinations of inputs not listed in Table I result in a HOLD condition for both Oxygen and Argon.

Table I entries are linguistically defined in a "fuzzy" manner, i.e. as "decrease", "Hold", "Increase". The rules can be determined from experience or based on an understanding of the physics of the system.

Defuzzification

In the third step, 814, the linguistic "what to do" instructions are "Defuzzified", i.e. converted to actual numbers which change the control settings (in the example, those for only Oxygen and Argon pressures).

EXAMPLE

The following is an example of a fuzzy logic control process calculation. In the example, we shall assume that the instantaneous operating point has drifted to a Cathode Voltage=370 Volts (Line A of FIG. 10($a$)) and a Total Pressure of 8.82 mBar (line B of FIG. 10($b$)). From the graphs of FIG. 10($a$), one may obtain a Voltage Membership 0.75 "LO" and 0.25 "OK". From the Pressure Membership Functions of FIG. 10($b$) one may obtain the pressure membership values of 0.30 "OK and 0.70"HI. (Note that these membership functions happen to add up to 1.00 in each case but they do not in general need to). These membership function values are shown in the top left hand box of FIG. 11 which will be used to track the calculation of the output for oxygen flow (i.e. percent valve opening of a piezoelectric valve).

Next, the membership of the output sets (DECRease, HOLD, INCRease) for oxygen is calculated. Two Rules are used to do this. The appropriate First Rule applied to the Pressure and Voltage membership functions has been found to be Rule Strength–MINimum.

Figure 11:
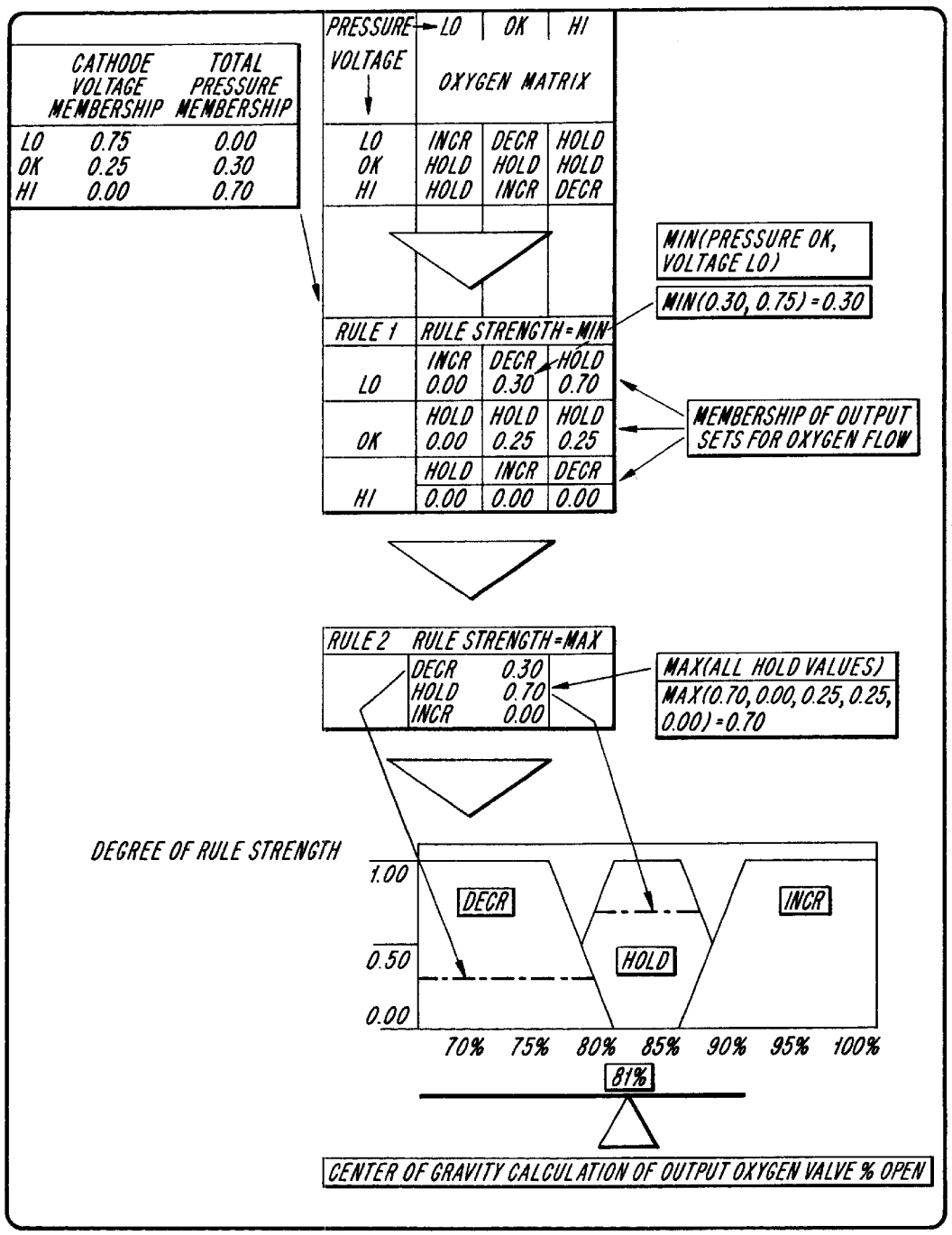
FIG. 11 presents details of the calculations performed in an illustrative Example of the implementation of techniques of the present invention.

That is, as illustrated in the box of FIG. 11 labeled "Rule Strength=MIN". The output membership is determined for "Pressure OK" and "Voltage LO"=MIN (0.30, 0.75)=0.30 and so on for the other eight values in this box.

The Second Rule which has been found to apply to the result of the first rule is MAXimum, as illustrated in the box labeled "Rule Strength=MAX". The resultant value for the membership function of HOLD is the maximum of all HOLD values=MAX (0.70, 0.00, 0.25, 0.25, 0.0)=0.70. Likewise the resultant value for the membership function of DECRease=MAX (0.30, 0.00)=0.30 and for INCRease= MAX (0.00, 0.00)=0.00. The "fuzzy" membership values of DECRease, HOLD and INCRease are next converted to "crisp" values which can be sent to an oxygen flow controller as a percentage of fully open of a piezoelectric valve or mass flow controller. We have chosen to do this by first constructing the membership defuzzification functions illustrated in the graph at the bottom of FIG. 11 and then applying a "Center of Gravity" calculation to "crispify" the output value as a percentage opening value. The "Center of Gravity" calculation can be envisaged as a balancing about the fulcrum point of 70% of the (DECR) area and 30% of the (HOLD) area to yield an output of (say) 81% valve opening.

It should be understood that the foregoing examples are adapted to a particular sputter deposition system and material and would probably require some modification for use with other systems and materials.

The controller should operate in real time to keep the operating point stable during the deposition of each layer. It is desirable that the measurement cycle time of the control system be less than 50 msec.

As noted above, once all the rules and rule strengths of a Fuzzy Logic Controller are established, the relationship between the inputs and the outputs are completely deterministic and can in principle and in practice be replaced by a lookup table which gives the appropriate output values (oxygen and argon settings in our case) for any given combination of input parameters (cathode voltage and total pressure as in the case of the foregoing example).

Indeed FIG. 12 indicates the type of three dimensional control surface that one can generate for oxygen flow and argon control versus the two above mentioned input parameters. The fuzzy logic algorithms can be used to provide a somewhat intuitive framework for developing rules and membership functions. It is relatively easy, with such fuzzy controls, to make intuitively understandable changes to the "low", "OK", "high" input regimes and the "DECR"ease, "HOLD", "INCR"ease regimes of the outputs. This would be much more difficult using just a lookup table. However, it may be noted that, once the lookup table has in effect been established in the development phase, it may well be easier to implement such a lookup table.

The instant invention has been described with respect to particular preferred embodiments and examples. The invention to be protected, however, is intended to be defined by the literal language of the claims and the equivalents thereof.

We claim:

1. A vacuum coating apparatus for providing optical coatings on plural lens elements, comprising:
   a vacuum chamber;
   a rotatable cylindrical holder for holding the plurality of lens elements; and
   at least one sputter source that is elongated along a lengthwise direction and that has a cathode and a plurality of anodes,
   wherein the at least one sputter source is disposed with the lengthwise direction parallel to a rotation axis of the cylindrical holder,
   wherein the anodes are disposed adjacent the cathode substantially along at least one line parallel to the lengthwise direction, and
   wherein the plural lens elements are arranged in columns and rows on the article holder and wherein pairs of anodes at opposite sides of the cathode are configured such each anode pair is aligned with a row on the cylindrical holder.

2. The apparatus of claim 1, wherein the anodes are disposed end to end along the entire length of the cathode.

3. The apparatus of claim 2, wherein ends of adjacent anodes are regularly spaced a predetermined distance apart.

4. The apparatus of claim 1, wherein the anodes are supplied with current from a controlled current supply.

5. The apparatus of claim 4, wherein the current supply is voltage limited.

6. The apparatus of claim 1, wherein the anodes are arranged in two lines with the cathode lying therebetween.

7. The vacuum coating apparatus of claim 1, wherein the lens elements are disposed in a predetermined pattern on the rotatable cylindrical holder.

8. The vacuum coating apparatus of claim 7, wherein the anodes are disposed in positions corresponding to positions of the lens elements disposed on the rotatable cylindrical holder.

9. The vacuum coating apparatus of claim 8, wherein the lens elements are arranged in columns and rows on the cylindrical holder, the columns being parallel to the rotation axis of the cylindrical holder, and wherein the anodes are configured in pairs, each anode pair being aligned with a row on the cylindrical holder.

10. The vacuum coating apparatus of claim 1, further comprising:
   a cathode power supply for providing a negative cathode voltage to the cathode; and
   an anode power supply with a plurality of channels for providing a controlled current to each anode.

11. The vacuum coating apparatus of claim 10, wherein the anodes are configured in pairs and wherein each anode pair is powered by a separate channel of the anode power supply.

12. The apparatus of claim 10, wherein the anodes are separated by ground shields located between adjacent anodes.

13. The vacuum coating apparatus of claim 11, wherein the anode currents are provided to separate pairs of anodes to produce coatings of substantially the same thickness on lens elements positioned in different locations on the cylindrical holder.

14. The vacuum coating apparatus of claim 1, wherein the length of the sputter source ranges from thirty inches to fifty inches, and wherein the number of pairs of anodes ranges from four pairs to fifteen pairs.

15. The vacuum coating apparatus of claim 1, wherein at least 200 lens elements are positioned on the cylindrical holder.

16. The vacuum coating apparatus of claim 1, wherein the sputter source is a planar magnetron sputter source.

17. The vacuum coating apparatus of claim 1, wherein pairs of anodes are powered by a controlled current power supply, and wherein substantially the same amount of current is provided to each active anode pair by the controlled current power supply.

18. An apparatus for reactive sputtering of a thin coating onto surfaces of plural articles, comprising:
   a vacuum chamber;
   a sputtering source that is elongated in a lengthwise direction and that has a cathode and a plurality of anodes;
   a rotatable article holder located in the vacuum chamber that rotates the plural articles past the sputtering source; and
   a source of reactive gas,
   wherein the articles are arranged on the article holder,
   wherein pairs of anodes on opposite sides of the cathode are powered by a controlled current power supply,
   wherein the articles are arranged in columns and rows on the article holder, and
   wherein each anode pair is aligned with a row on the cylindrical holder.

19. The apparatus of claim 18, wherein the anodes are each elongated and arranged end to end in lines on both sides of the cathode.

20. The apparatus of claim 19, wherein the anodes are electrically and physically isolated from one another.

21. The apparatus of claim 18, wherein the article holder is a hollow drum rotated about its central axis.

22. The apparatus of claim 18, wherein the articles are plastic lens elements.

23. The apparatus of claim 18, wherein a metal or semi-metal is sputtered by the sputter source.

24. The vacuum coating apparatus of claim 18, wherein substantially the same amount of current is provided to each active anode pair by the controlled current power supply.

25. The apparatus of claim 18, further comprising an elongated plasma applicator disposed adjacent to the sputtering source for producing a plasma to facilitate the reaction of the reactive gas with material sputtered from the sputtering source.

26. The apparatus of claim 18, wherein the recess of each anode comprises a first slot, the first slot including the opening of the recess, wherein the first slot is oriented along a first direction such that the opening of the recess is directed away from the cathode.

27. The apparatus of claim 26, wherein the recess of each anode further comprises a second slot that intersects the first slot, the second slot being oriented along a second direction different from the first direction.

28. The apparatus of claim 25, wherein the sputtering source is a first sputtering source and wherein the apparatus further comprises a second sputtering source located adjacent to at least one of the plasma applicator or the first sputtering source.

29. The apparatus of claim 28, wherein the second sputtering source sputters a different metal or semi-metal than the first sputtering source.

30. The apparatus of claim 29, wherein the reactive gas comprises oxygen or nitrogen.

31. The vacuum coating apparatus of claim 18, wherein the sputter source is a planar magnetron sputter source.

32. The apparatus of claim 18, further comprising a controller that receives an input signal corresponding to a cathode voltage and an input signal corresponding to a total gas pressure, and that controls a first flow rate for a first gas and a second flow rate for a second gas, wherein batch-to-batch uniformity of coating thickness and coating composition is maintained.

33. The apparatus of claim 32, wherein the first gas is a reactive gas and the second gas is a non-reactive gas.

34. A multi-anode device for use in sputter deposition, comprising:
   a cathode; and
   a plurality of anodes arranged in pairs in predetermined positions adjacent to first and second opposing sides of the cathode,
   wherein the anodes are arranged in a sawtooth pattern on each of the sides of the cathode.

35. The multi-anode device of claim 34, wherein the anodes disposed at a first side and a second side of the cathode and are arranged in similar patterns on both sides of the cathode.

36. The multi-anode device of claim 34, wherein the anodes disposed at a first side and second side of the cathode and are arranged in a mirror image pattern.

37. The multi-anode device of claim 34, wherein the cathode is elongated and substantially rectangular in shape.

38. The multi-anode device of claim 34, further comprising a controlled electronic power supply for supplying separately controllable current to each anode pair,
   wherein current may be applied to each anode pair to control a deposition rate in a locality of each anode.

39. The multi-anode device of claim 38, wherein substantially the same amount of current is provided to each active anode pair by the controlled electronic power supply.

40. The apparatus of claim 34, wherein each anode comprises a recess and wherein the recess of each anode comprises a first slot, the first slot including an opening of the recess, wherein the first slot is oriented along a first direction such that the opening of the recess is directed away from the cathode.

41. The apparatus of claim 40, wherein the recess of each anode further comprises a second slot that intersects the first slot, the second slot being oriented along a second direction different from the first direction.

42. A method for sputter coating a plurality of articles, comprising:

providing a vacuum chamber having at least one sputter source with a plurality of pairs of anodes and having an article holder that rotates about an axis;

locating plural articles on a radially outward facing surface of the article holder;

rotating the article holder relative to the at least one sputter source;

sputter coating radially outward facing surfaces of the articles while separately controlling current to each pair of anodes to reduce non-uniformity in coating thickness from article to article; and providing substantially the same amount of current to each active anode pair during sputter coating, wherein the articles are arranged in columns and rows on the outward facing surface of the article holder, and wherein the rows are aligned with pairs of anodes.

43. The method of claim 42, wherein the sputter coating comprises a reactive DC process wherein sputtered material reacts with a reactant gas to form a dielectric layer on the radially outward facing surfaces of the articles.

44. The method of claim 43, wherein the dielectric layer comprises at least one layer of a metal oxide or a semi-metal oxide.

45. The method of claim 44, wherein rates of flow into the chamber of one or more process gases are controlled in response to measured cathode voltage and total system pressure.

46. The method of claim 45, wherein reactive sputtering is performed and the rates of flow of both a reactive and a non-reactive gas are controlled.

47. The method of claim 42, wherein each anode comprises an electrically conducting member having an outer surface and having a recess with an opening at the outer surface, the recess being configured to provide at least one interior anode surface that remains substantially free of coating deposits during sputtering such that electrical conduction can be maintained between the at least one interior anode surface and a plasma.

* * * * *

UNITED STATES PATENT AND TRADEMARK OFFICE
CERTIFICATE OF CORRECTION

PATENT NO.    : 6,440,280 B1
DATED         : August 27, 2002
INVENTOR(S)   : Burton et al.

It is certified that error appears in the above-identified patent and that said Letters Patent is hereby corrected as shown below:

<u>Title page,</u>
Item [12], "Burton et al." should be -- Burton --.

Signed and Sealed this

Tenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO. : 6,440,280 B1
DATED : August 27, 2002
INVENTOR(S) : Clive H. Burton

Page 1 of 1

It is certified that error appears in the above-identified patent and that said Letters Patent is hereby corrected as shown below:

<u>Title page,</u>
Item [12], "Burton et al." should read -- Burton --.
Item [75], inventors should read -- Clive H. Burton --.

Item [56], References Cited, U.S. PATENT DOCUMENTS, insert -- 6,258,218, 07/2001, --
FOREIGN PATENT DOCUMENTS, "62-274076" should be -- 62-284076 --.

Signed and Sealed this

Seventeenth Day of December, 2002

JAMES E. ROGAN
*Director of the United States Patent and Trademark Office*